United States Patent
Honda

(10) Patent No.: US 11,898,008 B2
(45) Date of Patent: Feb. 13, 2024

(54) SUBSTRATE FOR PATTERN FORMATION

(71) Applicant: DAIKIN INDUSTRIES, LTD., Osaka (JP)

(72) Inventor: Yoshiaki Honda, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 636 days.

(21) Appl. No.: 16/624,128

(22) PCT Filed: Jul. 27, 2018

(86) PCT No.: PCT/JP2018/028306
§ 371 (c)(1),
(2) Date: Dec. 18, 2019

(87) PCT Pub. No.: WO2019/026803
PCT Pub. Date: Feb. 7, 2019

(65) Prior Publication Data
US 2020/0231748 A1 Jul. 23, 2020

(30) Foreign Application Priority Data
Aug. 4, 2017 (JP) .................... 2017-151838

(51) Int. Cl.
| | | |
|---|---|---|
| C08G 65/336 | (2006.01) | |
| C23C 14/04 | (2006.01) | |
| C23C 14/24 | (2006.01) | |
| C23C 14/18 | (2006.01) | |
| C23C 14/35 | (2006.01) | |
| H05K 3/14 | (2006.01) | |
| H05K 1/03 | (2006.01) | |

(52) U.S. Cl.
CPC .......... *C08G 65/336* (2013.01); *C23C 14/042* (2013.01); *C23C 14/18* (2013.01); *C23C 14/24* (2013.01); *C23C 14/35* (2013.01); *H05K 1/034* (2013.01); *H05K 3/143* (2013.01)

(58) Field of Classification Search
CPC ........................................ B32B 27/00
See application file for complete search history.

(56) References Cited

U.S. PATENT DOCUMENTS

| | | | |
|---|---|---|---|
| 2003/0000738 A1* | 1/2003 | Rumsey | H01L 24/49 257/E23.179 |
| 2006/0159849 A1 | 7/2006 | Morita et al. | |
| 2008/0317943 A1 | 12/2008 | Hirai | |
| 2014/0272725 A1* | 9/2014 | Hamade | G03F 7/11 430/325 |
| 2015/0248055 A1* | 9/2015 | Fall | G03F 7/0758 430/5 |
| 2017/0256332 A1 | 9/2017 | Miyazaki et al. | |
| 2018/0030280 A1 | 2/2018 | Mitsuhashi et al. | |
| 2021/0017394 A1 | 1/2021 | Mitsuhashi et al. | |

FOREIGN PATENT DOCUMENTS

| | | |
|---|---|---|
| CN | 101330801 A | 12/2008 |
| JP | 2004-146478 A | 5/2004 |
| JP | 2012-511635 A | 5/2012 |
| JP | 2016-48601 A | 4/2016 |
| WO | 2004/027889 A1 | 4/2004 |
| WO | 2010/068535 A1 | 6/2010 |
| WO | 2016/121211 A1 | 8/2016 |

OTHER PUBLICATIONS

International Search Report dated Sep. 4, 2018, in International Application No. PCT/JP2018/028306.
International Preliminary Report on Patentability with Translation of Written Opinion of the International Searching Authority for PCT/JP2018/028306 dated Feb. 13, 2020.
Communication dated Mar. 24, 2021, from the European Patent Office in European Application No. 18841956.8.

* cited by examiner

*Primary Examiner* — Ian A Rummel
(74) *Attorney, Agent, or Firm* — Sughrue Mion, PLLC

(57) ABSTRACT

A substrate for pattern formation, the substrate including at least a base material and a perfluoro(poly)ether group-containing silane compound-derived portion, wherein the base material includes at least one main face having a first region and a second region which is a region for pattern formation, adjacent to the first region, and the perfluoro (poly)ether group-containing silane compound-derived portion is disposed in the first region.

6 Claims, No Drawings

SUBSTRATE FOR PATTERN FORMATION

TECHNICAL FIELD

The present invention relates to a substrate for pattern formation.

BACKGROUND ART

Various studies have been conducted on a method including forming a pattern on the surface of a base material to produce a pattern-bearing substrate (hereinafter, also referred to as "pattern substrate").

For example, Patent Literature 1 describes pattern formation by coating a base material including an inorganic material on a main surface thereof, with at least one pattern-forming composition including at least one functional group-forming molecule, as a perfluoropolyether thiol compound, and thereafter subjecting the resultant to etching.

Patent Literature 2 describes fine metal pattern formation on a base material by preparing a base material where a fluorine-containing resin layer is provided on the surface, subjecting the fluorine-containing resin layer to a specified treatment to form a functional group such as a carboxy group on the fluorine-containing resin layer, and thereafter further applying a dispersion of a metal particle protected by a protecting agent having a specified structure.

CITATION LIST

Patent Literatures

Patent Literature 1: JP 2012-511635 A
Patent Literature 2: JP 2016-48601 A

SUMMARY OF INVENTION

Technical Problem

In Patent Literature 1, the inorganic material on a main surface of the base material is decomposed by etching. Such decomposition of the inorganic material, however, can need a long time. The method described in Patent Literature 2 needs processes, for example, preparation of the base material provided with a fluorine-containing resin layer, treatment of the fluorine-containing resin layer, and preparation of the dispersion of a metal particle protected by a protecting agent having a specified structure, and thus the method is complicated.

Accordingly, there is a need for a pattern substrate that can be formed by a simpler process.

Solution to Problem

The present inventor has made intensive studies, and as a result, has found that a novel substrate for pattern formation, which can be formed by a simple method, can be provided by using a perfluoro(poly)ether group-containing silane compound.

That is, a first aspect of the present invention provides
a substrate for pattern formation, the substrate including
at least a base material and a perfluoro(poly)ether group-containing silane compound-derived portion, wherein
the base material includes at least one main face having a first region and a second region which is a region for pattern formation, adjacent to the first region, and
the perfluoro(poly)ether group-containing silane compound-derived portion is disposed in the first region.

A second aspect of the present invention provides
a pattern substrate including the substrate for pattern formation of the present invention, and a pattern portion, wherein
the pattern portion is disposed in the second region of the substrate for pattern formation.

A third aspect of the present invention provides
a method of producing a substrate for pattern formation, the method including
forming a perfluoro(poly)ether group-containing silane compound-derived portion and a region for pattern formation on at least one main face of a base material, to produce a substrate for pattern formation.

A fourth aspect of the present invention provides
a method of producing a pattern substrate, the method including
forming a perfluoro(poly)ether group-containing silane compound-derived portion and a region for pattern formation on at least one main face of a base material, to produce a substrate for pattern formation, and
forming a pattern portion in a region for pattern formation of the substrate for pattern formation, to produce a pattern substrate.

Advantageous Effect of Invention

The present invention provides a novel substrate for pattern formation, which enables a pattern to be formed by a simple method.

DESCRIPTION OF EMBODIMENTS

Hereinafter, the present invention will be described, but the present invention is not intended to be limited to the following description.

(Substrate for Pattern Formation)

The substrate for pattern formation of the present invention includes at least a base material and a perfluoro(poly)ether group (hereinafter, sometimes referred to as "PFPE")-containing silane compound-derived portion. The base material includes at least one main face having a first region and a second region which is a region for pattern formation, adjacent to the first region. The PFPE-containing silane compound-derived portion is disposed in the first region.

The base material which can be used in the present invention may be any suitable material such as glass, a resin (which may be a natural or synthetic resin, for example, a common plastic material, and may be in the form of a plate, a film, or the like), a metal (which may be a single substance of a metal such as aluminum, copper or iron, or a composite such as an alloy thereof), ceramics, a semiconductor (silicon, germanium, or the like), a fiber (woven cloth, unwoven cloth, or the like), fur, leather, a wood material, a ceramic material, a stone material, or a building material.

The glass is preferably sapphire glass, soda-lime glass, alkali aluminosilicate glass, borosilicate glass, alkali-free glass, crystal glass, or quartz glass, particularly preferably chemically strengthened soda-lime glass, chemically strengthened alkali aluminosilicate glass, and chemically bonded borosilicate glass.

The resin is preferably an acrylic resin or polycarbonate.

For example, such a base material may include any material originally having a hydroxyl group at least on a surface portion thereof. Examples of such any material include glass, as well as a metal (in particular, base metal)

where a natural oxidized film or a thermal oxidized film is to be formed on the surface, ceramics and a semiconductor. Alternatively, when the base material has a hydroxyl group but insufficiently or when the base material originally does not have any hydroxyl group, as in a resin and the like, the base material can be subjected to any pre-treatment to thereby introduce or increase a hydroxyl group onto the surface of the base material. Examples of such a pre-treatment include a plasma treatment (for example, corona discharge) and ion beam irradiation. Such a plasma treatment can be suitably utilized to not only introduce or increase a hydroxyl group onto the surface of the base material, but also clean the surface of the base material (removal of foreign substances and the like). Another example of such a pre-treatment includes a method involving forming an interface adsorbent having a carbon-carbon unsaturated bonding group, in the form of a monomolecular film, on the surface of the base material in advance according to a LB method (Langmuir-Blodgett method), a chemical adsorption method, or the like, and thereafter cleaving an unsaturated bond under an atmosphere containing oxygen, nitrogen, and the like.

Alternatively, for example, the base material may include, at least on a surface portion thereof, a silicone compound having at least another reactive group, such as a Si—H group, or a material including alkoxysilane.

In a preferable embodiment, the base material is glass.

The shape of the base material is not limited, and can be appropriately determined depending on the application, a particular specification or the like of an article to be produced.

The thickness of the base material is, for example, in the range from 0.1 mm to 30 mm.

The base material has a first region and a second region on at least one main face. For example, such one main face may entirely correspond to the first region and the second region, or only partially correspond to the first region and the second region.

In one embodiment, the base material has a first region and a second region on both main faces thereof.

In another embodiment, the base material has a first region and a second region on any one main face.

The second region is a region for pattern formation, which is present with being adjacent to the first region. The region for pattern formation is a region where a pattern portion is to be formed. That is, in the case where the substrate for pattern formation further has a pattern portion (namely, in the case where a pattern substrate is formed), the pattern portion is formed on the region for pattern formation.

The base material is preferably exposed in the second region.

The second region may have a concavo-convex shape which allows a capillary phenomenon to be expressed in a composition for pattern portion formation, described below.

In a preferable embodiment, a plurality of first regions and/or a plurality of second regions are present in the substrate for pattern formation of the present invention.

The first region and the second region can have a shape suitable for the application, a particular specification or the like of the substrate for pattern formation (alternatively, a pattern substrate which is formed using the substrate for pattern formation). For example, the second region may have a lattice shape, or a configuration may be adopted where the first region and the second region each linearly shaped are alternately present (a configuration where such regions are disposed in a striped manner).

In the embodiment, each first region and each second region are preferably continuously present.

In the case where the second region has, for example, a lattice shape, the line width of the lattice may be in the range from 0.1 μm to 100 μm, in the range from 1 μm to 50 μm, or in the range from 1 μm to 10 μm. The line interval may be in the range from 0.1 μm to 100 μm, in the range from 1 μm to 50 μm, or in the range from 1 μm to 10 μm.

For example, the first region and the second region are disposed in a striped manner. In this case, two directions perpendicular to each other in a main face of the substrate for pattern formation of the present invention are defined as an X-axis direction and a Y-axis direction, respectively, the first region and the second region may be alternately present in the X-axis direction in the main face of the substrate for pattern formation and the first region and the second region may be continuously present in the Y-axis direction in the main face of the substrate for pattern formation. Each width of the first region (the width in the X-axis direction) may be in the range from 0.1 μm to 10 μm. For example, each width of the second region (the width in the X-axis direction) may be in the range from 0.1 μm to 10 μm.

The PFPE-containing silane compound-derived portion may be present with forming a convex shape and the second region may be present with forming a concave shape in the main face of the base material.

The PFPE-containing silane compound-derived portion is disposed in the first region. The thickness of the portion is, for example, in the range from 1 nm to 50 nm, preferably 1 nm to 30 nm, more preferably 1 nm to 15 nm. The PFPE-containing silane compound-derived portion may be a so-called thin layer.

In a preferable embodiment, the PFPE-containing silane compound is a compound represented by (A1), (A2), (B1), (B2), (C1), (C2), (D1) or (D2).

[Formula 1]

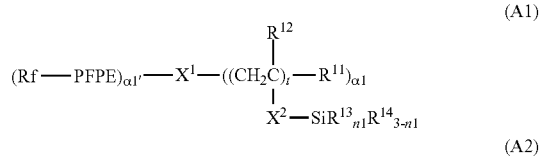

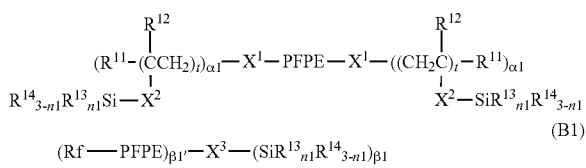

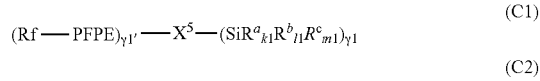

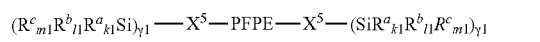

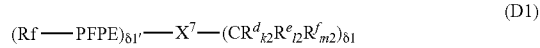

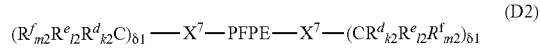

Hereinafter, a PFPE-containing silane compound represented by the formulae (A1), (A2), (B1), (B2), (C1), (C2), (D1) and (D2) will be described.

The "di- to decavalent organic group", as used herein, means a di- to decavalent group containing carbon. The di- to decavalent organic group is not limited, and examples thereof include a di- to decavalent group where 1 to 9 hydrogen atoms are further removed from a hydrocarbon group. The divalent organic group is not limited, and examples thereof include a divalent group where one hydrogen atom is further removed from a hydrocarbon group.

The "hydrocarbon group", as used herein, means a group which contains carbon and hydrogen and which is obtained by removing one hydrogen atom from a molecule. The hydrocarbon group is not limited, and examples thereof include a hydrocarbon group having 1 to 20 carbon atoms, optionally substituted with one or more substituents, such as an aliphatic hydrocarbon group and an aromatic hydrocarbon group. The "aliphatic hydrocarbon group" may be any linear, branched or cyclic group, and may be any saturated or unsaturated group. For example, the hydrocarbon group may contain one or more ring structures. The hydrocarbon group may have one or more N, O, S, Si, amide, sulfonyl, siloxane, carbonyl, carbonyloxy, and the like at an end thereof or in a molecular chain thereof.

Each substituent of the "hydrocarbon group", as used herein, is not limited, and examples thereof include a halogen atom; and one or more groups selected from a $C_{1-6}$ alkyl group, a $C_{2-6}$ alkenyl group, a $C_{2-6}$ alkynyl group, a $C_{3-10}$ cycloalkyl group, a $C_{3-10}$ unsaturated cycloalkyl group, a 5 to 10-membered heterocyclyl group, a 5 to 10-membered unsaturated heterocyclyl group, a $C_{6-10}$ aryl group and a 5 to 10-membered heteroaryl group each optionally substituted with one or more halogen atoms.

The alkyl group and the phenyl group may be herein unsubstituted or substituted, unless particularly noted. Each substituent of such groups is not limited, and examples thereof include one or more groups selected from a halogen atom, a $C_{1-6}$ alkyl group, a $C_{2-6}$ alkenyl group and a $C_{2-6}$ alkynyl group.

Formulae (A1) and (A2):

[Formula 2]

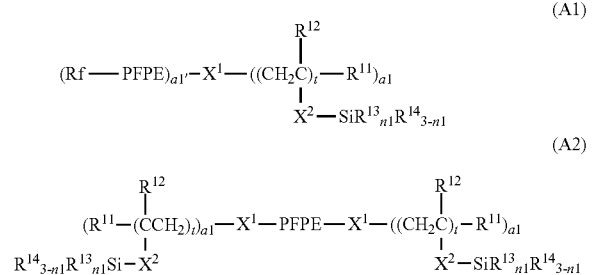

In the formulae, Rf, at each occurrence, independently represents an alkyl group having 1 to 16 carbon atoms, optionally substituted with one or more fluorine atoms.

The "alkyl group having 1 to 16 carbon atoms" in the alkyl group having 1 to 16 carbon atoms, optionally substituted with one or more fluorine atoms, may be linear or branched, and is preferably a linear or branched alkyl group having 1 to 6 carbon atoms, in particular, having 1 to 3 carbon atoms, more preferably a linear alkyl group having 1 to 3 carbon atoms.

Rf preferably represents an alkyl group having 1 to 16 carbon atoms, substituted with one or more fluorine atoms, more preferably a $CF_2H$—$C_{1-15}$ fluoroalkylene group or a $C_{1-16}$ perfluoroalkyl group, further preferably a $C_{1-16}$ perfluoroalkyl group.

The perfluoroalkyl group having 1 to 16 carbon atoms may be linear or branched, and is preferably a linear or branched perfluoroalkyl group having 1 to 6 carbon atoms, in particular, having 1 to 3 carbon atoms, more preferably a linear perfluoroalkyl group having 1 to 3 carbon atoms, specifically —$CF_3$, —$CF_2CF_3$ or —$CF_2CF_2CF_3$.

In the formulae, PFPE, at each occurrence, is independently a group represented by:

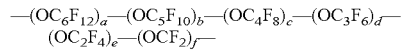

wherein a, b, c, d, e and f are each independently an integer of 0 or more and 200 or less, and the sum of a, b, c, d, e and f is at least 1. Here, a, b, c, d, e and f are each independently preferably an integer of 0 or more and 100 or less. The sum of a, b, c, d, e and f is preferably 5 or more, more preferably 10 or more. The sum of a, b, c, d, e and f is preferably 200 or less, more preferably 100 or less, for example, 10 or more and 200 or less, more specifically 10 or more and 100 or less. The occurrence order of the respective repeating units in parentheses with a, b, c, d, e or f is not limited in the formulae.

Such repeating units may be linear or branched, and are preferably linear. For example, —$(OC_6F_{12})$— may be —$(OCF_2CF_2CF_2CF_2CF_2CF_2)$—, —$(OCF(CF_3)CF_2CF_2CF_2CF_2)$—, —$(OCF_2CF(CF_3)CF_2CF_2CF_2)$—, —$(OCF_2CF_2CF(CF_3)CF_2CF_2)$—, —$(OCF_2CF_2CF_2CF(CF_3)CF_2)$—, —$(OCF_2CF_2CF_2CF_2CF(CF_3))$—, or the like, and is preferably —$(OCF_2CF_2CF_2CF_2CF_2CF_2)$—. For example, —$(OC_5F_{10})$— may be —$(OCF_2CF_2CF_2CF_2CF_2)$—, —$(OCF(CF_3)CF_2CF_2CF_2)$—, —$(OCF_2CF(CF_3)CF_2CF_2)$—, —$(OCF_2CF_2CF(CF_3)CF_2)$—, —$(OCF_2CF_2CF_2CF(CF_3))$— or the like, and is preferably —$(OCF_2CF_2CF_2CF_2CF_2)$—. For example, —$(OC_4F_8)$— may be any of —$(OCF_2CF_2CF_2CF_2)$—, —$(OCF(CF_3)CF_2CF_2)$—, —$(OCF_2CF(CF_3)CF_2)$—, —$(OCF_2CF_2CF(CF_3))$—, —$(OC(CF_3)_2CF_2)$—, —$(OCF_2C(CF_3)_2)$—, —$(OCF(CF_3)CF(CF_3))$—, —$(OCF(C_2F_5)CF_2)$— and —$(OCF_2CF(C_2F_5))$—, and is preferably —$(OCF_2CF_2CF_2CF_2)$—. For example, —$(OC_3F_6)$— may be any of —$(OCF_2CF_2CF_2)$—, —$(OCF(CF_3)CF_2)$— and —$(OCF_2CF(CF_3))$—, and is preferably —$(OCF_2CF_2CF_2)$—. For example, —$(OC_2F_4)$— may be any of —$(OCF_2CF_2)$— and —$(OCF(CF_3))$—, and is preferably —$(OCF_2CF_2)$—.

In one embodiment, PFPE is —$(OC_3F_6)_d$—, wherein d is an integer of 1 or more and 200 or less, preferably 5 or more and 200 or less, more preferably 10 or more and 200 or less. Preferably, PFPE is —$(OCF_2CF_2CF_2)_d$—, wherein d is an integer of 1 or more and 200 or less, preferably 5 or more and 200 or less, more preferably 10 or more and 200 or less, or —$(OCF(CF_3)CF_2)_d$—, wherein d is an integer of 1 or more and 200 or less, preferably 5 or more and 200 or less, more preferably 10 or more and 200 or less. More preferably, PFPE is —$(OCF_2CF_2CF_2)_d$—, wherein d is an integer of 1 or more and 200 or less, preferably 5 or more and 200 or less, more preferably 10 or more and 200 or less.

In another embodiment, PFPE is —$(OC_4F_8)_c$—$(OC_3F_6)_d$—$(OC_2F_4)_e$—$(OCF_2)_f$—, wherein c and d are each independently an integer of 0 or more and 30 or less, e and f are each independently an integer of 1 or more and 200 or less, preferably 5 or more and 200 or less, more preferably 10 or more and 200 or less, the sum of c, d, e and f is at least 5 or more, preferably 10 or more, and the occurrence order of the respective repeating units in parentheses with the subscript c, d, e or f is not limited in the formulae. Preferably, PFPE is —(OCF$_2$CF$_2$CF$_2$CF$_2$)$_c$—(OCF$_2$CF$_2$CF$_2$)$_d$—(OCF$_2$CF$_2$)$_e$—(OCF$_2$)$_f$—. In one embodiment, PFPE may be —(OC$_2$F$_4$)$_e$—(OCF$_2$)$_f$—, wherein e and f are each independently an integer of 1 or more and 200 or less, preferably 5 or more and 200 or less, more preferably 10 or more and 200 or less, and the occurrence order of the respective repeating units in parentheses with the subscript e or f is not limited in the formulae.

In still another embodiment, PFPE is a group represented by —(R$^6$-R$^7$)$_j$—. In the formula, R$^6$ is OCF$_2$ or OC$_2$F$_4$, preferably OC$_2$F$_4$. In the formula, R$^7$ is a group selected from OC$_2$F$_4$, OC$_3$F$_6$, OC$_4$F$_8$, OC$_6$F$_{10}$ and OC$_6$F$_{12}$, or a combination of two or three groups independently selected from such groups. Preferably, R$^7$ is a group selected from OC$_2$F$_4$, OC$_3$F$_6$ and OC$_4$F$_8$, a group selected from OC$_3$F$_6$, OC$_4$F$_8$, OC$_5$F$_{10}$ and OC$_6$F$_{12}$, or a combination of two or three groups independently selected from such groups. The combination of two or three groups independently selected from OC$_2$F$_4$, OC$_3$F$_6$ and OC$_4$F$_8$ is not limited, and examples thereof include —OC$_2$F$_4$OC$_3$F$_6$—, —OC$_2$F$_4$OC$_4$F$_8$—, —OC$_3$F$_6$OC$_2$F$_4$—, —OC$_3$F$_6$OC$_3$F$_6$—, —OC$_3$F$_6$OC$_4$F$_8$—, —OC$_4$F$_8$OC$_4$F$_8$—, —OC$_4$F$_8$OC$_3$F$_6$—, —OC$_4$F$_8$OC$_2$F$_4$—, —OC$_2$F$_4$OC$_2$F$_4$OC$_3$F$_6$—, —OC$_2$F$_4$OC$_2$F$_4$OC$_4$F$_8$—, —OC$_2$F$_4$OC$_3$F$_6$OC$_2$F$_4$—, —OC$_2$F$_4$OC$_3$F$_6$OC$_3$F$_6$—, —OC$_2$F$_4$OC$_4$F$_8$OC$_2$F$_4$—, —OC$_3$F$_6$OC$_2$F$_4$OC$_2$F$_4$—, —OC$_3$F$_6$OC$_2$F$_4$OC$_3$F$_6$—, —OC$_3$F$_6$OC$_3$F$_6$OC$_2$F$_4$—, and —OC$_4$F$_8$OC$_2$F$_4$OC$_2$F$_4$—. Here, j is an integer of 2 or more, preferably 3 or more, more preferably 5 or more, and is an integer of 100 or less, preferably 50 or less. In the formula, OC$_2$F$_4$, OC$_3$F$_6$, OC$_4$F$_8$, OC$_6$F$_{10}$ and OC$_6$F$_{12}$ may be each linear or branched, and are each preferably linear. In this embodiment, PFPE is preferably —(OC$_2$F$_4$—OC$_3$F$_6$)$_j$— or —(OC$_2$F$_4$—OC$_4$F$_8$)$_j$—.

The ratio of e to f in PFPE (hereinafter, referred to as "e/f ratio") is 0.1 or more and 10 or less, preferably 0.2 or more and 5 or less, more preferably 0.2 or more and 2 or less, further preferably 0.2 or more and 1.5 or less, still more preferably 0.2 or more and 0.85 or less. An e/f ratio of 10 or less more enhances lubricity, friction durability and chemical resistance (for example, durability to artificial sweat) of a layer obtained from the compound. A lower e/f ratio more enhances lubricity and friction durability of the layer. On the other hand, an e/f ratio of 0.1 or more can more enhance stability of the compound. A higher e/f ratio more enhances stability of the compound.

In one embodiment, PFPE in the formulae, at each occurrence, is independently a group represented by —(OC$_6$F$_{12}$)$_a$—(OC$_5$F$_{10}$)$_b$—(OC$_4$F$_8$)$_c$—(OC$_3$F$_6$)$_d$—(OC$_2$F$_4$)$_e$—(OCF$_2$)$_f$—, and PFPE has at least one branched structure. That is, in the present embodiment, PFPE has at least one CF$_3$ end (specifically, —CF$_3$, —C$_2$F$_5$, or the like, more specifically —CF$_3$). PFPE having such a structure can be contained to thereby more improve ultraviolet durability, water-repellency, oil-repellency, antifouling property (for example, preventing fouling such as fingerprints from adhering), chemical resistance, hydrolysis resistance, friction durability, heat resistance, moisture-proof property, and the like of the compound-derived portion.

In the embodiment, a, b, c, d, e and f are each independently an integer of 0 or more and 200 or less, and the sum of a, b, c, d, e and f is at least 1. Here, a, b, c, d, e and f are each independently preferably an integer of 0 or more and 100 or less. The sum of a, b, c, d, e and f is preferably 5 or more, more preferably 10 or more. The sum of a, b, c, d, e and f is preferably 200 or less, more preferably 100 or less, for example, 10 or more and 200 or less, more specifically 10 or more and 100 or less. The occurrence order of the respective repeating units in parentheses with a, b, c, d, e or f is not limited in the formulae.

In the embodiment, PFPE preferably has at least five, more preferably ten, particularly preferably twenty branched structures.

In the embodiment, the number of repeating units each having a branched structure, based on a total number of repeating units of 100 (for example, the sum of a, b, c, d, e and f), in the PFPE structure is preferably 40 or more, more preferably 60 or more, particularly preferably 80 or more. The number of repeating units each having a branched structure, based on a total number of repeating units of 100, in the PFPE structure may be, for example, 100 or less, or may be, for example, 90 or less.

In the embodiment, the number of repeating units each having a branched structure, based on a total number of repeating units of 100, in the PFPE structure is preferably in the range from 40 to 100, more preferably in the range from 60 to 100, particularly preferably in the range from 80 to 100.

In the embodiment, examples of the branched chain in the branched structure can include CF$_3$.

In the embodiment, examples of such a repeating unit having the branched structure, such as —(OC$_6$F$_{12}$)—, can include —(OCF(CF$_3$)CF$_2$CF$_2$CF$_2$CF$_2$)—, —(OCF$_2$CF(CF$_3$)CF$_2$CF$_2$CF$_2$)—, —(OCF$_2$CF$_2$CF(CF$_3$)CF$_2$CF$_2$)—, —(OCF$_2$CF$_2$CF$_2$CF(CF$_3$)CF$_2$)—, and —(OCF$_2$CF$_2$CF$_2$CF$_2$CF(CF$_3$))—. Examples of —(OC$_5$F$_{10}$)— can include —(OCF(CF$_3$)CF$_2$CF$_2$CF$_2$)—, —(OCF$_2$CF(CF$_3$)CF$_2$CF$_2$)—, —(OCF$_2$CF$_2$CF(CF$_3$)CF$_2$)—, and —(OCF$_2$CF$_2$CF$_2$CF(CF$_3$))—. Examples of —(OC$_4$F$_8$)— can include —(OCF(CF$_3$)CF$_2$CF$_2$)—, —(OCF$_2$CF(CF$_3$)CF$_2$)—, —(OCF$_2$CF$_2$CF(CF$_3$))—, —(OC(CF$_3$)$_2$CF$_2$)—, —(OCF$_2$C(CF$_3$)$_2$)—, —(OCF(CF$_3$)CF(CF$_3$))—, —(OCF(C$_2$F$_5$)CF$_2$)— and —(OCF$_2$CF(C$_2$F$_5$))—. Examples of —(OC$_3$F$_6$)— can include —(OCF(CF$_3$)CF$_2$)— and —(OCF$_2$CF(CF$_3$))—. Examples of —(OC$_2$F$_4$)— can include —(OCF(CF$_3$))—.

In the embodiment, PFPE can include not only such a repeating unit having the branched structure, but also a linear repeating unit. Examples of the linear repeating unit can include —(OCF$_2$CF$_2$CF$_2$CF$_2$CF$_2$CF$_2$)—, —(OCF$_2$CF$_2$CF$_2$CF$_2$CF$_2$)—, —(OCF$_2$CF$_2$CF$_2$CF$_2$)—, —(OCF$_2$CF$_2$CF$_2$)—, —(OCF$_2$CF$_2$)—.

In the embodiment, PFPE preferably has repeating units each having a branched structure, —(OC$_6$F$_{12}$)—, —(OC$_5$F$_{10}$)—, —(OC$_4$F$_8$)—, and —(OC$_3$F$_6$)—.

In the embodiment, PFPE more preferably has repeating units each having a branched structure, OC$_6$F$_{12}$, OC$_5$F$_{10}$, OC$_4$F$_8$, and OC$_3$F$_6$.

In one embodiment, PFPE is —(OC$_3$F$_6$)$_d$—, wherein d is an integer of 1 or more and 200 or less, preferably 5 or more and 200 or less, more preferably 10 or more and 200 or less, and PFPE has at least one branched structure.

In the embodiment, for example, PFPE may further include a linear repeating unit, —(OCF$_2$CF$_2$CF$_2$)—.

In the embodiment, PFPE preferably includes a repeating unit having a branched structure, OC$_3$F$_6$. PFPE is more preferably represented by formula: —(OCF$_2$CF(CF$_3$))$_d$. In the formula, d is an integer of 1 or more and 200 or less, preferably 5 or more and 200 or less, more preferably 10 or more and 200 or less.

In another embodiment, PFPE is —(OC$_4$F$_8$)$_c$—(OC$_3$F$_6$)$_d$—(OC$_2$F$_4$)$_e$—(OCF$_2$)$_f$—, wherein c and d are each independently an integer of 0 or more and 30 or less, e and f are each independently an integer of 1 or more and 200 or less, preferably 5 or more and 200 or less, more preferably 10 or more and 200 or less, the sum of c, d, e and f is at least 5 or more, preferably 10 or more, and the occurrence order of the respective repeating units in parentheses with the subscript c, d, e or f is not limited in the formula, and PFPE has at least one branched structure.

In still another embodiment, PFPE is a group represented by $-(R^6-R^7)_j-$, and PFPE has at least one branched structure. In the formula, $R^6$ is $OCF_2$ or $OC_2F_4$, preferably $OC_2F_4$. In the formula, $R^7$ is a group selected from $OC_2F_4$, $OC_3F_6$, $OC_4F_8$, $OC_5F_{10}$ and $OC_6F_{12}$, or a combination of two or three groups independently selected from such groups. Preferably, $R^7$ is a group selected from $OC_2F_6$, $OC_3F_6$ and $OC_4F_8$, a group selected from $OC_3F_6$, $OC_4F_8$, $OC_5F_{10}$ and $OC_6F_{12}$, or a combination of two or three groups independently selected from such groups. The combination of two or three groups independently selected from $OC_2F_4$, $OC_3F_6$ and $OC_4F_8$ is not limited, and examples thereof include $-OC_2F_4OC_3F_6-$, $-OC_2F_4OC_4F_8-$, $-OC_3F_6OC_2F_4-$, $-OC_3F_6OC_3F_6-$, $-OC_3F_6OC_4F_8-$, $-OC_4F_8OC_4F_8-$, $-OC_4F_8OC_3F_6-$, $-OC_4F_8OC_2F_4-$, $-OC_2F_4OC_2F_4OC_3F_6-$, $-OC_2F_4OC_2F_4OC_4F_8-$, $-OC_2F_4OC_3F_6OC_2F_4-$, $-OC_2F_4OC_3F_6OC_3F_6-$, $-OC_2F_4OC_4F_8OC_2F_4-$, $-OC_3F_6OC_2F_4OC_2F_4-$, $-OC_3F_6OC_2F_4OC_3F_6-$, $-OC_3F_6OC_3F_6OC_2F_4-$, and $-OC_4F_8OC_2F_4OC_2F_4-$. Here, j is an integer of 2 or more, preferably 3 or more, more preferably 5 or more, and is an integer of 100 or less, preferably 50 or less. In the formula, $OC_2F_4$, $OC_3F_6$, $OC_4F_8$, $OC_{10}F_{10}$ and $OC_6F_{12}$ each preferably have a branched structure.

In the embodiment, PFPE more preferably include repeating units each having a branched structure, $OC_6F_{12}$, $OC_5F_{10}$, $OC_4F_8$, and $OC_3F_6$.

The number average molecular weight of the -PFPE- portion in the PFPE-containing silane compound is not limited, and is, for example, 500 to 30,000, preferably 1,500 to 30,000, more preferably 2,000 to 10,000. The number average molecular weight is defined as a value obtained by $^{19}$F-NMR measurement.

In another embodiment, the number average molecular weight of the -PFPE- portion can be 500 to 30,000, preferably 1,000 to 20,000, more preferably 2,000 to 15,000, still more preferably 2,000 to 10,000, for example, 3,000 to 6,000.

In another embodiment, the number average molecular weight of the -PFPE- portion can be 4,000 to 30,000, preferably 5,000 to 10,000, more preferably 6,000 to 10,000.

In the formulae, each $R^{13}$, at each occurrence, independently represents a hydroxyl group or a hydrolyzable group.

The "hydrolyzable group", as used herein, means a group which can undergo a hydrolysis reaction, namely, means a group which can be dissociated from a main backbone of the compound by a hydrolysis reaction. Examples of the hydrolyzable group include $-OR$, $-OCOR$, $-O-N=CR_2$, $-NR_2$, $-NHR$, and a halogen atom, wherein R represents a substituted or unsubstituted alkyl group having 1 to 4 carbon atoms, and $-OR$ (namely, an alkoxy group) is preferable. Examples of R include unsubstituted alkyl groups such as a methyl group, an ethyl group, a propyl group, an isopropyl group, a n-butyl group and an isobutyl group; and substituted alkyl groups such as a chloromethyl group. Among them, an alkyl group, in particular, an unsubstituted alkyl group is preferable, and a methyl group or an ethyl group is more preferable. The hydroxyl group is not limited, and for example, may be generated by hydrolyzing the hydrolyzable group.

In the formulae, each $R^{14}$, at each occurrence, independently represents a hydrogen atom or an alkyl group having 1 to 22 carbon atoms, preferably an alkyl group having 1 to 4 carbon atoms.

In the formulae, each $R^{11}$, at each occurrence, independently represents a hydrogen atom or a halogen atom. The halogen atom is preferably an iodine atom, a chlorine atom or a fluorine atom, more preferably a fluorine atom.

In the formulae, each $R^{12}$, at each occurrence, independently represents a hydrogen atom or a lower alkyl group. The lower alkyl group is preferably an alkyl group having 1 to 20 carbon atoms, more preferably an alkyl group having 1 to 6 carbon atoms, and examples include a methyl group, an ethyl group and a propyl group.

In the formulae, n1 with respect to each $(-SiR^{13}{}_{n1}R^{14}{}_{3-n1})$ unit is independently an integer of 0 to 3, preferably 1 to 3, more preferably 3. In the formulae, at least one n1 is an integer of 1 to 3, namely, there is not any case where all n1(s) are simultaneously 0. In other words, at least one $R^{13}$ is present in the formulae.

In one embodiment, at least two Si atoms each bonded to the hydroxyl group or the hydrolyzable group are present in the formulae (A1) and (A2). That is, at least two $-SiR^{13}{}_{n1}R^{14}{}_{3-n1}$ structures (namely, $-SiR^{13}$ portions) where n is 1 or more are present in formulae (A1) and (A2).

In the formulae, each $X^1$ independently represents a single bond or a di- to decavalent organic group. $X^1$ is understood to be a linker which links a perfluoropolyether portion (namely, Rf-PFPE portion or -PFPE- portion) mainly providing water-repellency, surface lubricity, and the like, and a silane portion (namely, group in parentheses with α1) providing a binding ability to the base material, in any compound represented by formulae (A1) and (A2). Accordingly, $X^1$ may be any organic group as long as such any compound represented by formulae (A1) and (A2) can be stably present.

In another embodiment, $X^1$ can be $X^e$. $X^e$ represents a single bond or a di- to decavalent organic group, preferably represents a single bond, or a di- to decavalent organic group having at least one selected from the group consisting of $-C_6H_4-$ (namely, -phenylene-, hereinafter, representing a phenylene group.), $-CO-$ (carbonyl group), $-NR^4-$ and $-SO_2-$. Each $R^4$ independently represents a hydrogen atom, a phenyl group, or a $C_{1\ to\ 6}$ alkyl group (preferably methyl group), preferably a hydrogen atom or a methyl group. Such $-C_6H_4-$, $-CO-$, $-NR^4-$ or $-SO_2-$ is preferably contained in a molecular backbone of the PFPE-containing silane compound. The molecular backbone here represents a relatively longest binding chain in a molecule of the PFPE-containing silane compound.

$X^e$ more preferably represents a single bond, or a di- to decavalent organic group having at least one selected from the group consisting of $-C_6H_4-$, $-CONR^4-$, $-CONR^4-C_6H_4-$, $-CO-$, $-CO-C_6H_4-$, $-SO_2NR^4-$, $-SO_2NR^4-C_6H_4-$, $-SO_2-$, and $-SO_2-C_6H_4-$. Such $-C_6H_4-$, $-CONR^4-$, $-CONR^4-C_6H_4-$, $-CO-$, $-CO-C_6H_4-$, $-SO_2NR^4-$, $-SO_2NR^4-C_6H_4-$, $-SO_2-$, or $-SO_2-C_6H_4-$ is preferably contained in a molecular backbone of the PFPE-containing silane compound.

In the formulae, α1 is an integer of 1 to 9, and α1' is an integer of 1 to 9. Such α1 and α1' may be varied depending on the valence of $X^1$. The sum of α1 and α1' in formula (A1) is the same as the valence of $X^1$. For example, in the case where $X^1$ is a decavalent organic group, the sum of α1 and α1' is 10, and for example, α1 can be 9 and α1' can be 1, α1 can be 5 and α1' can be 5, or α1 can be 1 and α1' can be 9.

In the case where $X^1$ is a divalent organic group, α1 and α1' are each 1. In formula (A2), α1 corresponds to a value obtained by subtracting 1 from the valence of $X^1$.

$X^1$ is preferably a di- to heptavalent, more preferably di- to tetravalent, further preferably divalent organic group.

In one embodiment, $X^1$ is a di- to tetravalent organic group, α1 is 1 to 3, and α1' is 1.

In another embodiment, $X^1$ is a divalent organic group, α1 is 1, and α1' is 1. In such a case, formulae (A1) and (A2) are represented by the following formulae (A1') and (A2'), respectively.

[Formula 3]

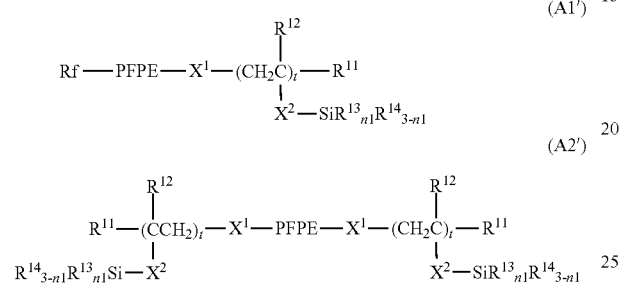

$$\text{Rf—PFPE—}X^1\text{—(CH}_2\text{C)}_t\text{—R}^{11} \quad (A1')$$
$$\underset{X^2\text{—SiR}^{13}{}_{n1}\text{R}^{14}{}_{3-n1}}{|}$$

$$(A2')$$

Examples of $X^1$ are not limited, and include a divalent group represented by the following formula:

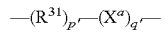

$-(R^{31})_{p'}-(X^a)_{q'}-$ wherein:
- $R^{31}$ represents a single bond, $-(CH_2)_{s'}-$ or an o-, m- or p-phenylene group, preferably represents $-(CH_2)_{s'}-$,
- s' is an integer of 1 to 20, preferably an integer of 1 to 6, more preferably an integer of 1 to 3, still more preferably 1 or 2,
- $X^a$ represents $-(X^b)_{l'}-$,
- each $X^b$, at each occurrence, independently represents a group selected from the group consisting of $-O-$, $-S-$, an o-, m- or p-phenylene group, $-C(O)O-$, $-Si(R^{33})_2-$, $-(Si(R^{33})_2O)_{m'}-Si(R^{33})_2-$, $-CONR^{34}-$, $-O-CONR^{34}-$, $-NR^{34}-$ and $-(CH_2)_{n'}-$,
- each $R^{33}$, at each occurrence, independently represents a phenyl group, a $C_{1-6}$ alkyl group or a $C_{1-6}$ alkoxy group, preferably a phenyl group or a $C_{1-6}$ alkyl group, more preferably a methyl group,
- each $R^{34}$, at each occurrence, independently represents a hydrogen atom, a phenyl group or a $C_{1-6}$ alkyl group (preferably a methyl group),
- m', at each occurrence, is independently an integer of 1 to 100, preferably an integer of 1 to 20,
- n', at each occurrence, is independently an integer of 1 to 20, preferably an integer of 1 to 6, more preferably an integer of 1 to 3,
- l' is an integer of 1 to 10, preferably an integer of 1 to 5, more preferably an integer of 1 to 3,
- p' is 0 or 1, and
- q' is 0 or 1,
- provided that at least one of p' and q' is 1, and the occurrence order of the respective repeating units in parentheses with p' or q' is not limited. Here, $R^{31}$ and $X^a$ (typically, any hydrogen atom in $R^{31}$ and $X^a$) are each optionally substituted with one or more substituents selected from a fluorine atom, a $C_{1-3}$ alkyl group and a $C_{1-3}$ fluoroalkyl group.

Preferably, $X^1$ represents $-(R^{31})_{p'}-(X^a)_{q'}-R^{32}-$. $R^{32}$ represents a single bond, $-(CH_2)_{t'}-$ or an o-, m- or p-phenylene group, preferably $-(CH_2)_{t'}-$. Here, t' is an integer of 1 to 20, preferably an integer of 2 to 6, more preferably an integer of 2 to 3. Here, $R^{32}$ (typically, any hydrogen atom in $R^{32}$) is optionally substituted with one or more substituents selected from a fluorine atom, a $C_{1-3}$ alkyl group and a $C_{1-3}$ fluoroalkyl group.

Preferably, $X^1$ can be
- a single bond,
- a $C_{1-20}$ alkylene group,
- $-R^{31}-X^c-R^{32}-$, or
- $-X^d-R^{32}-$ wherein $R^{31}$ and $R^{32}$ have the same meaning as described above. Herein, such an alkylene group is a group having a $-(C_\delta H_{2\delta})-$ structure, and is optionally substituted or unsubstituted and is optionally linear or branched.

More preferably, $X^1$ represents
- a single bond,
- a $C_{1-20}$ alkylene group,
- $-(CH_2)_{s'}-X^c-$,
- $-(CH_2)_{s'}-X^c-(CH_2)_{t'}-$
- $-X^d-$, or
- $-X^d-(CH_2)_{t'}-$ wherein s' and t' have the same meaning as described above.

In the formulae, $X^c$ represents
- $-O-$,
- $-S-$,
- $-C(O)O-$,
- $-CONR^{34}-$,
- $-O-CONR^{34}-$,
- $-Si(R^{33})_2-$,
- $-(Si(R^{33})_2O)_{m'}-Si(R^{33})_2-$,
- $-O-(CH_2)_{u'}-(Si(R^{33})_2O)_{m'}-Si(R^{33})_2-$,
- $-O-(CH_2)_{u'}-Si(R^{33})_2-O-Si(R^{33})_2-CH_2CH_2-Si(R^{33})_2-O-Si(R^{33})_2-$,
- $-O-(CH_2)_{u'}-Si(OCH_3)_2OSi(OCH_3)_2-$,
- $-CONR^{34}-(CH_2)_{u'}-(Si(R^{33})_2O)_{m'}-Si(R^{33})_2-$,
- $-CONR^{34}-(CH_2)_{u'}-N(R^{34})-$, or
- $-CONR^{34}-$ (o-, m- or p-phenylene)-$Si(R^{33})_2-$ wherein $R^{33}$, $R^{34}$ and m' have the same meaning as described above, and u' is an integer of 1 to 20, preferably an integer of 2 to 6, more preferably an integer of 2 to 3. $X^c$ is preferably $-O-$.

In the formulae, $X^d$ represents
- $-S-$,
- $-C(O)O-$,
- $-CONR^{34}-$,
- $-CONR^{34}-(CH_2)_{u'}-(Si(R^{33})_2O)_{m'}-Si(R^{33})_2-$,
- $-CONR^{34}-(CH_2)_{u'}-N(R^{34})-$, or
- $-CONR^{34}-$ (o-, m- or p-phenylene)-$Si(R^{33})_2-$ wherein each symbol has the same meaning as described above.

More preferably, $X^1$ can be
- a single bond,
- a $C_{1-20}$ alkylene group,
- $-(CH_2)_{s'}-X^c-(CH_2)_{t'}-$, or
- $-X^d-(CH_2)_{t'}-$ wherein each symbol has the same meaning as described above.

Still more preferably, $X^1$ is
- a single bond,
- a $C_{1-20}$ alkylene group,
- $-(CH_2)_{s'}-O-(CH_2)_{t'}-$, —$(CH_2)_s$—$(Si(R^{33})_2O)_{m'}$—$Si(R^{33})_2$—$(CH_2)_{t'}$—,
—$(CH_2)_s$—O—$(CH_2)_{u'}$—$(Si(R^{33})_2O)_{m'}$—$Si(R^{33})_2$—$(CH_2)_{t'}$—, or
—$(CH_2)_s$—O—$(CH_2)_{t'}$—$Si(R^{33})_2$—$(CH_2)_{u'}$—$Si(R^{33})_2$—$(C_vH_{2v})$— wherein $R^{33}$, m', s', t' and u' have the same meaning as described above, and v is an integer of 1 to 20, preferably an integer of 2 to 6, more preferably an integer of 2 to 3.

In the formula, —$(C_vH_{2v})$— may be linear or branched, and may be, for example, —$CH_2$—, —$CH_2CH_2$—, —$CH_2CH_2CH_2$—, —$CH(CH_3)$—, or —$CH(CH_3)CH_2$—.

The $X^1$ group is optionally substituted with one or more substituents selected from a fluorine atom, a $C_{1-3}$ alkyl group and a $C_{1-3}$ fluoroalkyl group (preferably, $C_{1-3}$ perfluoroalkyl group).

In one embodiment, the $X^1$ group can be other than a —O—$C_{1-6}$ alkylene group.

In another embodiment, examples of the $X^1$ group include the following groups:

—D—Si($R^{41}$)($R^{41}$)—O—Si($R^{41}$)($R^{41}$)—E—

—D—Si($R^{41}$)($R^{41}$)—O—Si($R^{41}$)($R^{41}$)—O—Si($R^{41}$)($R^{41}$)—E—

—D—Si($R^{41}$)($R^{41}$)—O—Si($R^{41}$)($R^{41}$)—O—Si($R^{41}$)($R^{41}$)—O—Si($R^{41}$)($R^{41}$)—E—

—D—Si($R^{41}$)($R^{41}$)—O—Si($R^{41}$)($R^{41}$)—O—Si($R^{41}$)($R^{41}$)—O—Si($R^{41}$)($R^{41}$)—O—Si($R^{41}$)($R^{41}$)—E—

—D—Si($R^{41}$)($R^{41}$)—CH$_2$CH$_2$—Si($R^{41}$)($R^{41}$)—E—

—D—Si($R^{41}$)($R^{41}$)—(phenylene)—Si($R^{41}$)($R^{41}$)—E—

—D—Si($R^{41}$)($R^{41}$)—(bicyclic)—Si($R^{41}$)($R^{41}$)—E— wherein each $R^{41}$ is independently a hydrogen atom, a phenyl group, an alkyl group having 1 to 6 carbon atoms, or a $C_{1-6}$ alkoxy group, preferably a methyl group;

D is a group selected from
—$CH_2O(CH_2)_2$—,
—$CH_2O(CH_2)_3$—,
—$CF_2O(CH_2)_3$—,
—$(CH_2)_2$—,
—$(CH_2)_3$—,
—$(CH_2)_4$—,
—CONH—$(CH_2)_3$—,
—CON($CH_3$)—$(CH_2)_3$—,
—CON(Ph)-$(CH_2)_3$— wherein Ph means phenyl; and

[structure: —C(O)—N($R^{42}$)—(phenyl with Si($R^{42}$)($R^{42}$)—CH$_2$CH$_2$—)]

wherein each $R^{42}$ independently represents a hydrogen atom, a $C_{1-6}$ alkyl group or a $C_{1-6}$ alkoxy group, preferably a methyl group or a methoxy group, more preferably a methyl group;

E is —$(CH_2)_{ne}$— (ne is an integer of 2 to 6), and

D is bonded to PFPE as a molecular backbone, and E is bonded to an opposite group to PFPE.

Specific examples of $X^1$ include:
a single bond
—$CH_2OCH_2$—,
—$CH_2O(CH_2)_2$—,
—$CH_2O(CH_2)_3$—,
—$CH_2O(CH_2)_6$—,
—$CH_2O(CH_2)_3Si(CH_3)_2OSi(CH_3)_2(CH_2)_2$—,
—$CH_2O(CH_2)_3Si(CH_3)_2OSi(CH_3)_2OSi(CH_3)_2(CH_2)_2$—,
—$CH_2O(CH_2)_3Si(CH_3)_2O(Si(CH_3)_2O)_2Si(CH_3)_2(CH_2)_2$—,
—$CH_2O(CH_2)_3Si(CH_3)_2O(Si(CH_3)_2O)_3Si(CH_3)_2(CH_2)_2$—,
—$CH_2O(CH_2)_3Si(CH_3)_2O(Si(CH_3)_2O)_{10}Si(CH_3)_2(CH_2)_2$—,
—$CH_2O(CH_2)_3Si(CH_3)_2O(Si(CH_3)_2O)_{20}Si(CH_3)_2(CH_2)_2$—,
—$CH_2OCF_2CHFOCF_2$—,
—$CH_2OCF_2CHFOCF_2CF_2$—,
—$CH_2OCF_2CHFOCF_2CF_2CF_2$—,
—$CH_2OCH_2CF_2CF_2OCF_2$—,
—$CH_2OCH_2CF_2CF_2OCF_2CF_2$—,
—$CH_2OCH_2CF_2CF_2OCF_2CF_2CF_2$—,
—$CH_2OCH_2CF_2CF_2OCF(CF_3)CF_2OCF_2$—,
—$CH_2OCH_2CF_2CF_2OCF(CF_3)CF_2OCF_2CF_2$—,
—$CH_2OCH_2CF_2CF_2OCF(CF_3)CF_2OCF_2CF_2CF_2$—,
—$CH_2OCH_2CHFCF_2OCF_2$—,
—$CH_2OCH_2CHFCF_2OCF_2CF_2$—,
—$CH_2OCH_2CHFCF_2OCF_2CF_2CF_2$—,
—$CH_2OCH_2CHFCF_2OCF(CF_3)CF_2OCF_2$—,
—$CH_2OCH_2CHFCF_2OCF(CF_3)CF_2OCF_2CF_2$—,
—$CH_2OCH_2CHFCF_2OCF(CF_3)CF_2OCF_2CF_2CF_2$—,
—$CH_2OCF_2CHFOCF_2CF_2CF_2$—C(O) NH—$CH_2$—,
—$CH_2OCH_2(CH_2)_7CH_2Si(OCH_3)_2OSi(OCH_3)_2(CH_2)_2Si(OCH_3)_2OSi(OCH_3)_2(CH_2)_2$—,
—$CH_2OCH_2CH_2CH_2Si(OCH_3)_2OSi(OCH_3)_2(CH_2)_3$—,
—$CH_2OCH_2CH_2CH_2Si(OCH_2CH_3)_2OSi(OCH_2CH_3)_2(CH_2)_3$—,
—$CH_2OCH_2CH_2CH_2Si(OCH_3)_2OSi(OCH_3)_2(CH_2)_2$—,
—$CH_2OCH_2CH_2CH_2Si(OCH_2CH_3)_2OSi(OCH_2CH_3)_2(CH_2)_2$—,
—$(CH_2)_2$—$Si(CH_3)_2$—$(CH_2)_2$—,
—$CH_2$—,
—$(CH_2)_2$—,
—$(CH_2)_3$—,
—$(CH_2)_4$—,
—$(CH_2)_5$—,
—$(CH_2)_6$—,
—CO—,
—CONH—, —CONH—CH$_2$—,
—CONH—(CH$_2$)$_2$—,
—CONH—(CH$_2$)$_3$—,
—CON(CH$_3$)—(CH$_2$)$_3$—,
—CON(Ph)-(CH$_2$)$_3$— wherein Ph means phenyl;
—CONH—(CH$_2$)$_6$—,
—CON(CH$_3$)—(CH$_2$)$_6$—,
—CON(Ph)-(CH$_2$)$_6$— wherein Ph means phenyl;
—CONH—(CH$_2$)$_2$NH(CH$_2$)$_3$—,
—CONH—(CH$_2$)$_6$NH(CH$_2$)$_3$—,
—CH$_2$O—CONH—(CH$_2$)$_3$—,
—CH$_2$O—CONH—(CH$_2$)$_6$—,
—S—(CH$_2$)$_3$—,
—(CH$_2$)$_2$S(CH$_2$)$_3$—,
—CONH—(CH$_2$)$_3$Si(CH$_3$)$_2$OSi(CH$_3$)$_2$(CH$_2$)$_2$—,
—CONH—(CH$_2$)$_3$Si(CH$_3$)$_2$OSi(CH$_3$)$_2$OSi(CH$_3$)$_2$(CH$_2$)$_2$—,
—CONH—(CH$_2$)$_3$Si(CH$_3$)$_2$O(Si(CH$_3$)$_2$O)$_2$Si(CH$_3$)$_2$(CH$_2$)$_2$—,
—CONH—(CH$_2$)$_3$Si(CH$_3$)$_2$O(Si(CH$_3$)$_2$O)$_3$Si(CH$_3$)$_2$(CH$_2$)$_2$—,
—CONH—(CH$_2$)$_3$Si(CH$_3$)$_2$O(Si(CH$_3$)$_2$O)$_{10}$Si(CH$_3$)$_2$(CH$_2$)$_2$—,
—CONH—(CH$_2$)$_3$Si(CH$_3$)$_2$O(Si(CH$_3$)$_2$O)$_{20}$Si(CH$_3$)$_2$(CH$_2$)$_2$—,
—C(O)O—(CH$_2$)$_3$—,
—C(O)O—(CH$_2$)$_6$—,
—CH$_2$—O—(CH$_2$)$_3$—Si(CH$_3$)$_2$—(CH$_2$)$_2$—Si(CH$_3$)$_2$—(CH$_2$)$_2$—,
—CH$_2$—O—(CH$_2$)$_3$—Si(CH$_3$)$_2$—(CH$_2$)$_2$—Si(CH$_3$)$_2$—CH(CH$_3$)—,
—CH$_2$—O—(CH$_2$)$_3$—Si(CH$_3$)$_2$—(CH$_2$)$_2$—Si(CH$_3$)$_2$—(CH$_2$)$_3$—,
—CH$_2$—O—(CH$_2$)$_3$—Si(CH$_3$)$_2$—(CH$_2$)$_2$—Si(CH$_3$)$_2$—CH(CH$_3$)—CH$_2$—,
—OCH$_2$—,
—O(CH$_2$)$_3$—,
—OCFHCF$_2$—, and

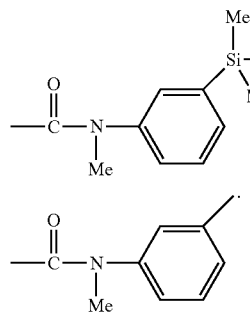

In more preferable embodiment, X$^1$ represents X$^{e'}$. X$^{e'}$ is a single bond, an alkylene group having 1 to 6 carbon atoms, —R$^{51}$—C$_6$H$_4$—R$^{52}$—, —R$^{51}$—CONR$^4$—R$^{52}$—, —R$^{51}$—CONR$^4$—C$_6$H$_4$—R$^{52}$—, —R$^{51}$—CO—R$^{52}$—, —R$^{51}$—CO—C$_6$H$_4$—R$^{52}$—, —R$^{51}$—SO$_2$NR$^4$—R$^{52}$—, —R$^{51}$—SO$_2$NR$^4$—C$_6$H$_4$—R$^{52}$—, —R$^{51}$—SO$_2$—R$^{52}$—, or —R$^{51}$—SO$_2$—C$_6$H$_4$—R$^{52}$—. R$^{51}$ and R$^{52}$ each independently represent a single bond or an alkylene group having 1 to 6 carbon atoms, preferably a single bond or alkylene group having 1 to 3 carbon atoms. R$^4$ has the same meaning as described above. The alkylene group is substituted or unsubstituted, preferably unsubstituted. Examples of the substituent of the alkylene group can include a halogen atom, preferably a fluorine atom. The alkylene group is linear or branched, preferably linear.

In a further preferable embodiment, X$^{e'}$ can be
a single bond,
an alkylene group having 1 to 6 carbon atoms, preferably having 1 to 3 carbon atoms
—C$_6$H$_4$—R$^{52'}$—,
—CONR$^{4'}$—R$^{52'}$—,
—CONR$^{4'}$—C$_6$H$_4$—R$^{52'}$—,
—CO—R$^{52'}$—,
—CO—C$_6$H$_4$—R$^{52'}$—,
—SO$_2$NR$^{4'}$—R$^{52'}$—,
—SO$_2$NR$^{4'}$—C$_6$H$_4$—R$^{52'}$—,
—SO$_2$—R$^{52'}$—,
—SO$_2$—C$_6$H$_4$—R$^{52'}$—,
—R$^{51'}$—C$_6$H$_4$—,
—R$^{51'}$—CONR$^{4'}$—,
—R$^{51'}$—CONR$^{4'}$—C$_6$H$_4$—,
—R$^{51'}$—CO—,
—R$^{51'}$—CO—C$_6$H$_4$—,
—R$^{51'}$—SO$_2$NR$^{4'}$—,
—R$^{51'}$—SO$_2$NR$^{4'}$—C$_6$H$_4$—,
—R$^{51'}$—SO$_2$—,
—R$^{51'}$—SO$_2$—C$_6$H$_4$—,
—C$_6$H$_4$—,
—CONR$^{4'}$—,
—CONR$^{4'}$—C$_6$H$_4$—,
—CO—,
—CO—C$_6$H$_4$—,
—SO$_2$NR$^{4'}$—,
—SO$_2$NR$^{4'}$—C$_6$H$_4$—,
—SO$_2$—, or
—SO$_2$—C$_6$H$_4$—, wherein R$^{51'}$ and R$^{52'}$ each independently are a linear alkylene group having 1 to 6 carbon atoms, preferably having 1 to 3 carbon atoms, and
R$^{4'}$ is a hydrogen atom or methyl.

In the present embodiment, specific examples of X$^{e'}$ include
a single bond,
an alkylene group having 1 to 6 carbon atoms,
—CONH—,
—CONH—CH$_2$—,
—CONH—(CH$_2$)$_2$—,
—CONH—(CH$_2$)$_3$—,
—CON(CH$_3$)—,
—CON(CH$_3$)—CH$_2$—,
—CON(CH$_3$)—(CH$_2$)$_2$—,
—CON(CH$_3$)—(CH$_2$)$_3$—,
—CH$_2$—CONH—,
—CH$_2$—CONH—CH$_2$—,
—CH$_2$—CONH—(CH$_2$)$_2$—,
—CH$_2$—CONH—(CH$_2$)$_3$—,
—CONH—C$_6$H$_4$—,
—CON(CH$_3$)—C$_6$H$_4$—,
—CH$_2$—CON(CH$_3$)—CH$_2$—,
—CH$_2$—CON(CH$_3$)—(CH$_2$)$_2$—,
—CH$_2$—CON(CH$_3$)—(CH$_2$)$_3$—,
—CON(CH$_3$)—C$_6$H$_4$—,
—CO—,
—CO—C$_6$H$_4$—,
—C$_6$H$_4$—,
—SO$_2$NH—,
—SO$_2$NH—CH$_2$—,
—SO$_2$NH—(CH$_2$)$_2$—,
—SO$_2$NH—(CH$_2$)$_3$—,
—SO$_2$NH—C$_6$H$_4$—, —SO₂N(CH₃)—,
—SO₂N(CH₃)—CH₂—,
—SO₂N(CH₃)—(CH₂)₂—,
—SO₂N(CH₃)—(CH₂)₃—,
—SO₂N(CH₃)—C₆H₄—,
—SO₂—,
—SO₂—CH₂—,
—SO₂—(CH₂)₂—,
—SO₂—(CH₂)₃—, or
—SO₂—C₆H₄—.

In one embodiment, $X^{e'}$ is a single bond. In the present embodiment, PFPE and a group having a binding ability to the base material (namely, a group in parentheses with α1 in (A1) and (A2)) are directly bonded.

In still another embodiment, $X^1$ is a group represented by formula: —$(R^{16})_x$—$(CFR^{17})_y$—$(CH_2)_z$—. In the formula, x, y and z are each independently an integer of 0 to 10, the sum of x, y and z is 1 or more, and the occurrence order of the respective repeating units in parentheses is not limited in the formulae.

In the formulae, each $R^{16}$, at each occurrence, independently represents an oxygen atom, phenylene, carbazolylene, —$NR^{18}$—, wherein $R^{18}$ represents a hydrogen atom or an organic group, or a divalent organic group. Preferably, $R^{16}$ is an oxygen atom or a divalent polar group.

The "divalent polar group" is not limited, and examples thereof include —C(O)—, —C(=NR¹⁹)—, and —C(O)NR¹⁹—, wherein $R^{19}$ represents a hydrogen atom or a lower alkyl group. The "lower alkyl group" is, for example, an alkyl group having 1 to 6 carbon atoms, such as a methyl group, an ethyl group, or a n-propyl group, and such a group is optionally substituted with one or more fluorine atoms.

In the formulae, each $R^{17}$, at each occurrence, is independently a hydrogen atom, a fluorine atom or a lower fluoroalkyl group, preferably a fluorine atom. The "lower fluoroalkyl group" is, for example, a fluoroalkyl group having 1 to 6 carbon atoms, preferably having 1 to 3 carbon atoms, preferably a perfluoroalkyl group having 1 to 3 carbon atoms, more preferably a trifluoromethyl group or a pentafluoroethyl group, further preferably a trifluoromethyl group.

In this embodiment, $X^1$ is preferably a group represented by formula: —$(O)_x$—$(CF_2)_y$—$(CH_2)_z$—, wherein x, y and z have the same meaning as described above, and the occurrence order of the respective repeating units in parentheses is not limited in the formula.

Examples of the group represented by formula: —$(O)_x$—$(CF_2)_y$—$(CH_2)_z$— include —$(O)_{x'}$—$(CH_2)_{z''}$—O—$[(CH_2)_{z'''}$—O—$]_{z''''}$ and —$(O)_{x'}$—$(CF_2)_{y''}$—$(CH_2)_{z''}$—O—$[(CH_2)_{z'''}$—O—$]_{z''''}$, wherein x' is 0 or 1, y'', z'' and z''' are each independently an integer of 1 to 10, and z'''' is 0 or 1. Herein, a left end of such a group is bonded to PFPE.

In another preferable embodiment, $X^1$ is —O—$CFR^{20}$—$(CF_2)_{e'}$—.

Each $R^{20}$ independently represents a fluorine atom or a lower fluoroalkyl group. The lower fluoroalkyl group is here, for example, a fluoroalkyl group having 1 to 3 carbon atoms, preferably a perfluoroalkyl group having 1 to 3 carbon atoms, more preferably a trifluoromethyl group or a pentafluoroethyl group, further preferably a trifluoromethyl group.

Each e' is independently 0 or 1.

In one specific example, $R^{20}$ is a fluorine atom and e' is 1.

In still another embodiment, examples of the $X^1$ group include the following group:

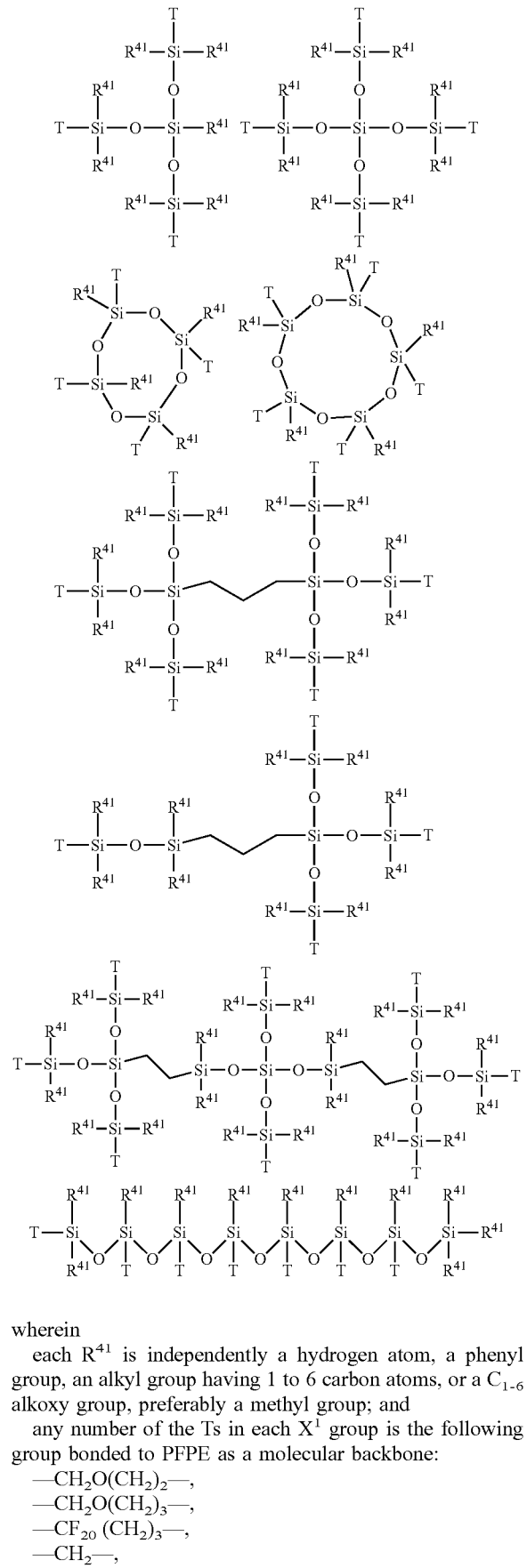

wherein
each $R^{41}$ is independently a hydrogen atom, a phenyl group, an alkyl group having 1 to 6 carbon atoms, or a $C_{1-6}$ alkoxy group, preferably a methyl group; and any number of the Ts in each $X^1$ group is the following group bonded to PFPE as a molecular backbone:
—CH₂O(CH₂)₂—,
—CH₂O(CH₂)₃—,
—CF₂O(CH₂)₃—,
—CH₂—, —(CH$_2$)$_2$—,
—(CH$_2$)$_3$—,
—(CH$_2$)$_4$—,
—CONH—(CH$_2$)$_3$—,
—CON(CH$_3$)—(CH$_2$)$_3$—,
—CON(Ph)-(CH$_2$)$_3$— wherein Ph means phenyl; or

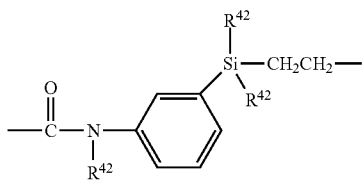

wherein each R$^{42}$ independently represents a hydrogen atom, a C$_{1-6}$ alkyl group or a C$_{1-6}$ alkoxy group, preferably a methyl group or a methoxy group, more preferably a methyl group, some other of the Ts is —(CH$_2$)$_{n''}$— (n'' is an integer of 2 to 6) bonded to an opposite group to PFPE as a molecular backbone, and the remaining of the Ts, if present, can be independently a methyl group, a phenyl group, a C$_{1-6}$ alkoxy group, or a radical scavenging group or an UV absorbing group.

The radical scavenging group is not limited as long as it can scavenge a radical generated by light irradiation, and examples thereof include a residue of benzophenones, benzotriazoles, benzoates, phenyl salicylates, crotonic acids, malonates, organoacrylates, hindered amines, hindered phenols, or triazines.

The UV absorbing group is not limited as long as it can absorb ultraviolet light, and examples thereof include a residue of benzotriazoles, hydroxybenzophenones, esters of substituted and unsubstituted benzoic acid or salicylic acid compounds, acrylates or alkoxy cinnamates, oxamides, oxanilides, benzoxazinones, and benzoxazoles.

In a preferable embodiment, examples of a preferable radical scavenging group or UV absorbing group include

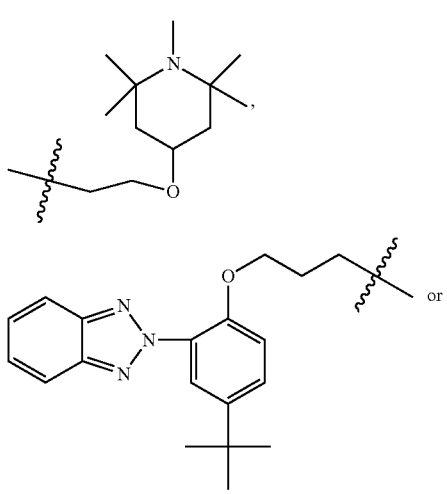

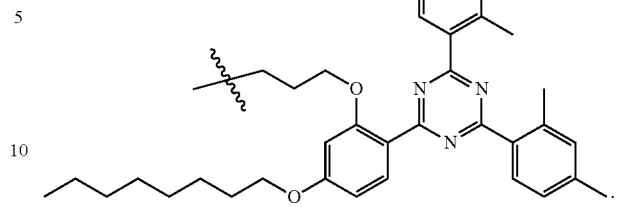

In this embodiment, X$^1$ (and, the following X$^3$, X$^5$ and X$^7$) can be a tri- to decavalent organic group.

In the formulae, each X$^2$, at each occurrence, independently represents a single bond or a divalent organic group. X$^2$ is preferably an alkylene group having 1 to 20 carbon atoms, more preferably —(CH$_2$)$_u$—, wherein u is an integer of 0 to 2.

In the formulae, each t is independently an integer of 1 to 10. In a preferable embodiment, t is an integer of 1 to 6. In another preferable embodiment, t is an integer of 2 to 10, preferably an integer of 2 to 6.

Preferable compounds represented by formulae (A1) and (A2) are compounds represented by the following formula (A1') and (A2'), respectively:

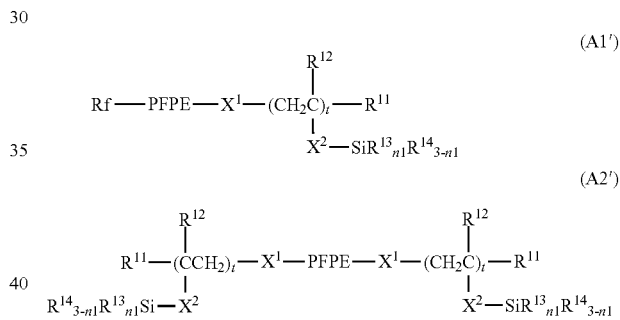

wherein:
each PFPE is independently a group represented by formula:

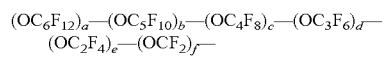

wherein a, b, c, d, e and f are each independently an integer of 0 or more and 200 or less, the sum of a, b, c, d, e and f is at least 1, and the occurrence order of the respective repeating units in parentheses with a, b, c, d, e or f is not limited in the formula;

each Rf, at each occurrence, independently represents an alkyl group having 1 to 16 carbon atoms, optionally substituted with one or more fluorine atoms;

each R$^{13}$, at each occurrence, independently represents a hydroxyl group or a hydrolyzable group;

each R$^{14}$, at each occurrence, independently represents a hydrogen atom or an alkyl group having 1 to 22 carbon atoms;

each R$^{11}$, at each occurrence, independently represents a hydrogen atom or a halogen atom;

each R$^{12}$, at each occurrence, independently represents a hydrogen atom or a lower alkyl group;

n1 is an integer of 1 to 3, preferably 3;

each $X^1$, at each occurrence, is independently $-O-CFR^{20}-(CF_2)_{e'}-$;

each $R^{20}$, at each occurrence, is independently a fluorine atom or a lower fluoroalkyl group;

each e', at each occurrence, is independently 0 or 1;

$X^2$ is $-(CH_2)_u-$;

each u, at each occurrence, is independently an integer of 0 to 2; and each t, at each occurrence, is independently an integer of 2 to 10.

Such any compound represented by formulae (A1) and (A2) can be obtained by, for example, introducing iodine into an end of a perfluoropolyether derivative corresponding to an Rf-PFPE- portion, as a raw material, and reacting a vinyl monomer corresponding to $-CH_2CR^{12}(X^2-SiR^{13}{}_{n1}R^{14}{}_{3-n1})-$.

Formulae (B1) and (B2):

$$(Rf-PFPE)_{\beta1'}-X^3-(SiR^{13}{}_{n1}R^{14}{}_{3-n1})_{\beta1} \quad (B1)$$

$$(R^{14}{}_{3-n1}R^{13}{}_{n1}Si)_{\beta1'}-X-PFPE-X^3-(SiR^{13}{}_{n1}R^{14}{}_{3-n1})_{\beta1} \quad (B2)$$

In formulae (B1) and (B2), Rf, PFPE, $R^{13}$, $R^{14}$ and n1 have the same meanings as described with respect to formulae (A1) and (A2).

In the formulae, each $X^3$ independently represents a single bond or a di- to decavalent organic group. $X^3$ is understood to be a linker which links a perfluoropolyether portion (namely, Rf-PFPE portion or -PFPE-portion) mainly providing water-repellency, surface lubricity, and the like, and a silane portion (specifically, $-SiR^{13}{}_{n1}R^{14}{}_{3-n1}$) providing a binding ability to the base material, in any compound represented by formulae (B1) and (B2). Accordingly, $X^3$ may be any organic group as long as such any compound represented by formulae (B1) and (B2) can be stably present.

In another embodiment, $X^3$ represents $X^e$. $X^e$ has the same meaning as described above.

In the formulae, β1 is an integer of 1 to 9 and β1' is an integer of 1 to 9. Such β1 and β1' can be varied depending on the valence of $X^3$. In formula (B1), the sum of β1 and β1' is the same as the valence of $X^3$. For example, in the case where $X^3$ is a decavalent organic group, the sum of β1 and β1' is 10, and for example, β1 can be 9 and β1' can be 1, β1 can be 5 and β1' can be 5, or β1 can be 1 and β1' can be 9. In the case where $X^3$ is a divalent organic group, β1 and β1' is 1. In formula (B2), β1 corresponds to a value obtained by subtracting 1 from the valence of $X^3$.

$X^3$ is preferably a di- to heptavalent, more preferably di- to tetravalent, further preferably divalent organic group.

In one embodiment, $X^3$ is a di- to tetravalent organic group, β1 is 1 to 3, and β1' is 1.

In another embodiment, $X^3$ is a divalent organic group, β1 is 1, and β1' is 1. In such a case, formulae (B1) and (B2) are represented by the following formulae (B1') and (B2'), respectively:

$$Rf-PFPE-X^3-SiR^{13}{}_{n1}R^{14}{}_{3-n1} \quad (B1')$$

$$R^{14}{}_{3-n1}R^{13}{}_{n1}Si-X^3-PFPE-X^3-SiR^{13}{}_{n1}R^{14}{}_{3-n1} \quad (B2')$$

wherein:

each PFPE is independently a group represented by formula:

$$-(OC_6F_{12})_a-(OC_5F_{10})_b-(OC_4F_8)_c-(OC_3F_6)_d-(OC_2F_4)_e-(OCF_2)_f-$$

wherein a, b, c, d, e and f are each independently an integer of 0 or more and 200 or less, the sum of a, b, c, d, e and f is at least 1, and the occurrence order of the respective repeating units in parentheses with the subscript a, b, c, d, e or f is not limited in the formula;

each Rf, at each occurrence, independently represents an alkyl group having 1 to 16 carbon atoms, optionally substituted with one or more fluorine atoms;

each $R^{13}$, at each occurrence, independently represents a hydroxyl group or a hydrolyzable group;

each $R^{14}$, at each occurrence, independently represents a hydrogen atom or an alkyl group having 1 to 22 carbon atoms;

n1 is an integer of 1 to 3, preferably 3; and $X^3$ is $-CH_2O(CH_2)_2-$, $-CH_2O(CH_2)_3-$ or $-CH_2O(CH_2)_6-$.

Examples of $X^3$ are not limited, and include the same as described with respect to $X^1$.

In particular, preferable specific examples of $X^3$ include $-CH_2OCH_2-$, $-CH_2O(CH_2)_2-$, $-CH_2O(CH_2)_3-$, $-CH_2O(CH_2)_6-$, $-CH_2O(CH_2)_3Si(CH_3)_2OSi(CH_3)_2(CH_2)_2-$, $-CH_2O(CH_2)_3Si(CH_3)_2OSi(CH_3)_2OSi(CH_3)_2(CH_2)_2-$, $-CH_2O(CH_2)_3Si(CH_3)_2O(Si(CH_3)_2O)_2Si(CH_3)_2(CH_2)_2-$, $-CH_2O(CH_2)_3Si(CH_3)_2O(Si(CH_3)_2O)_3Si(CH_3)_2(CH_2)_2-$, $-CH_2O(CH_2)_3Si(CH_3)_2O(Si(CH_3)_2O)_{10}Si(CH_3)_2(CH_2)_2-$, $-CH_2O(CH_2)_3Si(CH_3)_2O(Si(CH_3)_2O)_{20}Si(CH_3)_2(CH_2)_2-$, $-CH_2OCF_2CHFOCF_2-$, $-CH_2OCF_2CHFOCF_2CF_2-$, $-CH_2OCF_2CHFOCF_2CF_2CF_2-$, $-CH_2OCH_2CF_2CF_2OCF_2-$, $-CH_2OCH_2CF_2CF_2OCF_2CF_2-$, $-CH_2OCH_2CF_2CF_2OCF_2CF_2CF_2-$, $-CH_2OCH_2CF_2CF_2OCF(CF_3)CF_2OCF_2-$, $-CH_2OCH_2CF_2CF_2OCF(CF_3)CF_2OCF_2CF_2-$, $-CH_2OCH_2CF_2CF_2OCF(CF_3)CF_2OCF_2CF_2CF_2-$, $-CH_2OCH_2CHFCF_2OCF_2-$, $-CH_2OCH_2CHFCF_2OCF_2CF_2-$, $-CH_2OCH_2CHFCF_2OCF_2CF_2CF_2-$, $-CH_2OCH_2CHFCF_2OCF(CF_3)CF_2OCF_2-$, $-CH_2OCH_2CHFCF_2OCF(CF_3)CF_2OCF_2CF_2-$, $-CH_2OCH_2CHFCF_2OCF(CF_3)CF_2OCF_2CF_2CF_2-$, $-CH_2OCF_2CHFOCF_2CF_2CF_2-C(O)NH-CH_2-$, $-CH_2OCH_2(CH_2)_7CH_2Si(OCH_3)_2OSi(OCH_3)_2(CH_2)_2Si(OCH_3)_2OSi(OCH_3)_2(CH_2)_2-$, $-CH_2OCH_2CH_2CH_2Si(OCH_3)_2OSi(OCH_3)_2(CH_2)_3-$, $-CH_2OCH_2CH_2CH_2Si(OCH_2CH_3)_2OSi(OCH_2CH_3)_2(CH_2)_3-$, $-CH_2OCH_2CH_2CH_2Si(OCH_3)_2OSi(OCH_3)_2(CH_2)_2-$, $-CH_2OCH_2CH_2CH_2Si(OCH_2CH_3)_2OSi(OCH_2CH_3)_2(CH_2)_2-$, $-(CH_2)_2-Si(CH_3)_2-(CH_2)_2-$, $-CH_2-$, $-(CH_2)_2-$, $-(CH_2)_3-$, $-(CH_2)_4-$, $-(CH_2)_5-$, $-(CH_2)_6-$, $-CO-$, $-CONH-$, $-CONH-(CH_2)_3-$, $-CON(CH_3)-(CH_2)_3-$, $-CON(Ph)-(CH_2)_3-$ wherein Ph means phenyl;

$-CONH-(CH_2)_6-$,

—CON(CH$_3$)—(CH$_2$)$_6$—,
—CON(Ph)-(CH$_2$)$_6$— wherein Ph means phenyl;
—CONH—(CH$_2$)$_2$NH(CH$_2$)$_3$—,
—CONH—(CH$_2$)$_6$NH(CH$_2$)$_3$—,
—CH$_2$O—CONH—(CH$_2$)$_3$—,
—CH$_2$O—CONH—(CH$_2$)$_6$—,
—S—(CH$_2$)$_3$—,
—(CH$_2$)$_2$S(CH$_2$)$_3$—,
—CONH—(CH$_2$)$_3$Si(CH$_3$)$_2$OSi(CH$_3$)$_2$(CH$_2$)$_2$—,
—CONH—(CH$_2$)$_3$Si(CH$_3$)$_2$OSi(CH$_3$)$_2$OSi(CH$_3$)$_2$(CH$_2$)$_2$—,
—CONH—(CH$_2$)$_3$Si(CH$_3$)$_2$O(Si(CH$_3$)$_2$O)$_2$Si(CH$_3$)$_2$(CH$_2$)$_2$—,
—CONH—(CH$_2$)$_3$Si(CH$_3$)$_2$O(Si(CH$_3$)$_2$O)$_3$Si(CH$_3$)$_2$(CH$_2$)$_2$—,
—CONH—(CH$_2$)$_3$Si(CH$_3$)$_2$O(Si(CH$_3$)$_2$O)$_{10}$Si(CH$_3$)$_2$(CH$_2$)$_2$—,
—CONH—(CH$_2$)$_3$Si(CH$_3$)$_2$O(Si(CH$_3$)$_2$O)$_{20}$Si(CH$_3$)$_2$(CH$_2$)$_2$—,
—C(O)O—(CH$_2$)$_3$—,
—C(O)O—(CH$_2$)$_6$—,
—CH$_2$—O—(CH$_2$)$_3$—Si(CH$_3$)$_2$—(CH$_2$)$_2$—Si(CH$_3$)$_2$—(CH$_2$)$_2$—,
—CH$_2$—O—(CH$_2$)$_3$—Si(CH$_3$)$_2$—(CH$_2$)$_2$—Si(CH$_3$)$_2$—CH(CH$_3$)—,
—CH$_2$—O—(CH$_2$)$_3$—Si(CH$_3$)$_2$—(CH$_2$)$_2$—Si(CH$_3$)$_2$—(CH$_2$)$_3$—,
—CH$_2$—O—(CH$_2$)$_3$—Si(CH$_3$)$_2$—(CH$_2$)$_2$—Si(CH$_3$)$_2$—CH(CH$_3$)—CH$_2$—,
—OCH$_2$—,
—O(CH$_2$)$_3$—,
—OCFHCF$_2$—, and

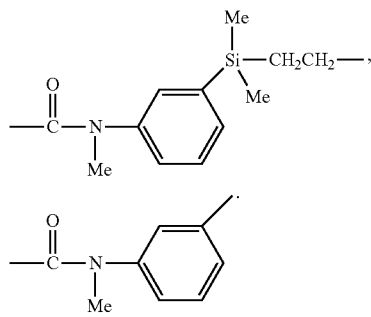

In another preferable embodiment, X$^3$ represents X$^{e'}$. X$^{e'}$ has the same meaning as described above.

In one embodiment, X$^{e'}$ is a single bond. In the present embodiment, PFPE and a group having a binding ability to the base material (namely, a group in parentheses with β1 in (B1) and (B2)) are directly bonded.

In one embodiment, at least two Si atoms each bonded to the hydroxyl group or the hydrolyzable group are present in the formulae (B1) and (B2). That is, at least two SiR$^{13}$ structures are present in formulae (B1) and (B2).

Preferable compounds represented by formulae (B1) and (B2) are compounds represented by the following formula (B1') and (B2'), respectively:

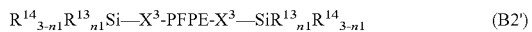

wherein:
each PFPE is independently a group represented by formula:

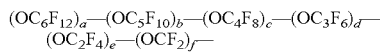

wherein a, b, c, d, e and f are each independently an integer of 0 or more and 200 or less, the sum of a, b, c, d, e and f is at least 1, and the occurrence order of the respective repeating units in parentheses with the subscript a, b, c, d, e or f is not limited in the formula;

each Rf, at each occurrence, independently represents an alkyl group having 1 to 16 carbon atoms, optionally substituted with one or more fluorine atoms;

each R$^{13}$, at each occurrence, independently represents a hydroxyl group or a hydrolyzable group;

each R$^{14}$, at each occurrence, independently represents a hydrogen atom or an alkyl group having 1 to 22 carbon atoms;

n1 is an integer of 1 to 3, preferably 3; and

X$^3$ is —CH$_2$O(CH$_2$)$_2$—, —CH$_2$O(CH$_2$)$_3$— or —CH$_2$O(CH$_2$)$_6$—.

Such any compound represented by formulae (B1) and (B2) can be produced by a known method, for example, a method described in Japanese Patent Laid-Open No. 2013-117012, or an improved method thereof.

Formulae (C1) and (C2):

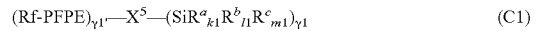

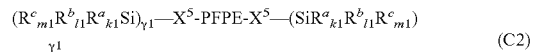

In formulae (C1) and (C2), Rf and PFPE have the same meanings as described with respect to formulae (A1) and (A2).

In the formulae, each X$^5$ independently represents a single bond or a di- to decavalent organic group. X$^5$ is understood to be a linker which links a perfluoropolyether portion (namely, Rf-PFPE portion or -PFPE-portion) mainly providing water-repellency, surface lubricity, and the like, and a silane portion (specifically, —SiR$^a_{k1}$R$^b_{l1}$R$^c_{m1}$ group) providing a binding ability to the base material, in any compound represented by formulae (C1) and (C2). Accordingly, X$^5$ may be any organic group as long as such any compound represented by formulae (C1) and (C2) can be stably present.

In another embodiment, X$^5$ represents X$^e$. X$^e$ has the same meaning as described above.

In the formulae, γ1 is an integer of 1 to 9 and γ1' is an integer of 1 to 9. Such γ1 and γ1' can be varied depending on the valence of X$^5$. In formula (C1), the sum of γ1 and γ1' is the same as the valence of X$^5$. For example, in the case where X$^5$ is a decavalent organic group, the sum of γ1 and γ1' is 10, and for example, γ1 can be 9 and γ1' can be 1, γ1 can be 5 and γ1' can be 5, or γ1 can be 1 and γ1' can be 9. In the case where X$^5$ is a divalent organic group, γ1 and γ1' is 1. In formula (C2), γ1 corresponds to a value obtained by subtracting 1 from the valence of X$^5$.

X$^5$ is preferably a di- to heptavalent, more preferably di- to tetravalent, further preferably divalent organic group.

In one aspect, X$^5$ is a di- to tetravalent organic group, γ1 is 1 to 3, and γ1' is 1.

In another embodiment, X$^5$ is a divalent organic group, γ1 is 1, and γ1' is 1. In such a case, formulae (C1) and (C2) are represented by the following formulae (C1') and (C2'), respectively.

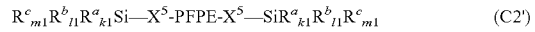

Examples of X$^5$ are not limited, and include the same as described with respect to X$^1$.

In particular, preferable specific examples of $X^5$ include
—$CH_2OCH_2$—,
—$CH_2O(CH_2)_2$—,
—$CH_2O(CH_2)_3$—,
—$CH_2O(CH_2)_6$—,
—$CH_2O(CH_2)_3Si(CH_3)_2OSi(CH_3)_2(CH_2)_2$—,
—$CH_2O(CH_2)_3Si(CH_3)_2OSi(CH_3)_2OSi(CH_3)_2(CH_2)_2$—,
—$CH_2O(CH_2)_3Si(CH_3)_2O(Si(CH_3)_2O)_2Si(CH_3)_2(CH_2)_2$—,
—$CH_2O(CH_2)_3Si(CH_3)_2O(Si(CH_3)_2O)_3Si(CH_3)_2(CH_2)_2$—,
—$CH_2O(CH_2)_3Si(CH_3)_2O(Si(CH_3)_2O)_{10}Si(CH_3)_2(CH_2)_2$—,
—$CH_2O(CH_2)_3Si(CH_3)_2O(Si(CH_3)_2O)_{20}Si(CH_3)_2(CH_2)_2$—,
—$CH_2OCF_2CHFOCF_2$—,
—$CH_2OCF_2CHFOCF_2CF_2$—,
—$CH_2OCF_2CHFOCF_2CF_2CF_2$—,
—$CH_2OCH_2CF_2CF_2OCF_2$—,
—$CH_2OCH_2CF_2CF_2OCF_2CF_2$—,
—$CH_2OCH_2CF_2CF_2OCF_2CF_2CF_2$—,
—$CH_2OCH_2CF_2CF_2OCF(CF_3)CF_2OCF_2$—,
—$CH_2OCH_2CF_2CF_2OCF(CF_3)CF_2OCF_2CF_2$—,
—$CH_2OCH_2CF_2CF_2OCF(CF_3)CF_2OCF_2CF_2CF_2$—,
—$CH_2OCH_2CHFCF_2OCF_2$—,
—$CH_2OCH_2CHFCF_2OCF_2CF_2$—,
—$CH_2OCH_2CHFCF_2OCF_2CF_2CF_2$—,
—$CH_2OCH_2CHFCF_2OCF(CF_3)CF_2OCF_2$—,
—$CH_2OCH_2CHFCF_2OCF(CF_3)CF_2OCF_2CF_2$—,
—$CH_2OCH_2CHFCF_2OCF(CF_3)CF_2OCF_2CF_2CF_2$—,
—$CH_2OCF_2CHFOCF_2CF_2CF_2$—$C(O)NH$—$CH_2$—,
—$CH_2OCH_2(CH_2)_7CH_2Si(OCH_3)_2OSi(OCH_3)_2(CH_2)_2Si(OCH_3)_2OSi(OCH_3)_2(CH_2)_2$—,
—$CH_2OCH_2CH_2CH_2Si(OCH_3)_2OSi(OCH_3)_2(CH_2)_3$—,
—$CH_2OCH_2CH_2CH_2Si(OCH_2CH_3)_2OSi(OCH_2CH_3)_2(CH_2)_3$—,
—$CH_2OCH_2CH_2CH_2Si(OCH_3)_2OSi(OCH_3)_2(CH_2)_2$—,
—$CH_2OCH_2CH_2CH_2Si(OCH_2CH_3)_2OSi(OCH_2CH_3)_2(CH_2)_2$—,
—$(CH_2)_2$—$Si(CH_3)_2$—$(CH_2)_2$—,
—$CH_2$—,
—$(CH_2)_2$—,
—$(CH_2)_3$—,
—$(CH_2)_4$—,
—$(CH_2)_5$—,
—$(CH_2)_6$—,
—$CO$—,
—$CONH$—,
—$CONH$—$CH_2$—,
—$CONH$—$(CH_2)_2$—,
—$CONH$—$(CH_2)_3$—,
—$CON(CH_3)$—$(CH_2)_3$—,
—$CON(Ph)$-$(CH_2)_3$— wherein Ph means phenyl;
—$CONH$—$(CH_2)_6$—,
—$CON(CH_3)$—$(CH_2)_6$—,
—$CON(Ph)$-$(CH_2)_6$— wherein Ph means phenyl;
—$CONH$—$(CH_2)_2NH(CH_2)_3$—,
—$CONH$—$(CH_2)_6NH(CH_2)_3$—,
—$CH_2O$—$CONH$—$(CH_2)_3$—,
—$CH_2O$—$CONH$—$(CH_2)_6$—,
—$S$—$(CH_2)_3$—,
—$(CH_2)_2S(CH_2)_3$—,
—$CONH$—$(CH_2)_3Si(CH_3)_2OSi(CH_3)_2(CH_2)_2$—,
—$CONH$—$(CH_2)_3Si(CH_3)_2OSi(CH_3)_2OSi(CH_3)_2(CH_2)_2$—;
—$CONH$—$(CH_2)_3Si(CH_3)_2O(Si(CH_3)_2O)_2Si(CH_3)_2(CH_2)_2$—,
—$CONH$—$(CH_2)_3Si(CH_3)_2O(Si(CH_3)_2O)_3Si(CH_3)_2(CH_2)_2$—,
—$CONH$—$(CH_2)_3Si(CH_3)_2O(Si(CH_3)_2O)_{10}Si(CH_3)_2(CH_2)_2$,
—$CONH$—$(CH_2)_3Si(CH_3)_2O(Si(CH_3)_2O)_{20}Si(CH_3)_2(CH_2)_2$,
—$C(O)O$—$(CH_2)_3$—,
—$C(O)O$—$(CH_2)_6$—,
—$CH_2$—$O$—$(CH_2)_3$—$Si(CH_3)_2$—$(CH_2)_2$—$Si(CH_3)_2$—$(CH_2)_2$—,
—$CH_2$—$O$—$(CH_2)_3$—$Si(CH_3)_2$—$(CH_2)_2$—$Si(CH_3)_2$—$CH(CH_3)$—,
—$CH_2$—$O$—$(CH_2)_3$—$Si(CH_3)_2$—$(CH_2)_2$—$Si(CH_3)_2$—$(CH_2)_3$—,
—$CH_2$—$O$—$(CH_2)_3$—$Si(CH_3)_2$—$(CH_2)_2$—$Si(CH_3)_2$—$CH(CH_3)$—$CH_2$—,
—$OCH_2$—,
—$O(CH_2)_3$—,
—$OCFHCF_2$—, and

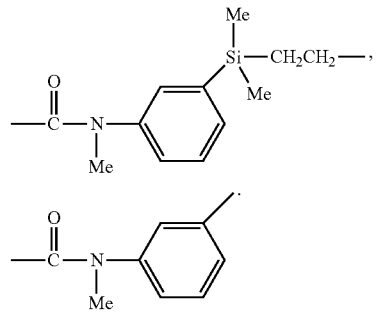

In another preferable embodiment, $X^5$ represents $X^{e'}$. $X^{e'}$ has the same meaning as described above.

In one embodiment, $X^{e'}$ is a single bond. In the present embodiment, PFPE and a group having a binding ability to the base material (namely, a group in parentheses with γ1 in (C1) and (C2)) are directly bonded.

In the formulae, each $R^a$, at each occurrence, independently represents —$Z^3$—$SiR^{71}_{p1}R^{72}_{q1}R^{73}_{r1}$.

In the formulae, each $Z^3$, at each occurrence, independently represents an oxygen atom or a divalent organic group.

$Z^3$ is preferably a divalent organic group, and does not encompass any group which is taken together with a Si atom at an end of a molecular backbone in formula (C1) or formula (C2) (Si atom to which $R^a$ is bonded) to form a siloxane bond.

$Z^3$ is preferably a $C_{1-6}$ alkylene group, —$(CH_2)_q$—O—$(CH_2)_h$—, wherein g is an integer of 1 to 6, and h is an integer of 1 to 6, or -phenylene-$(CH_2)_i$—, wherein i is an integer of 0 to 6), more preferably a $C_{1-3}$ alkylene group. Such a group is optionally substituted with one or more substituents selected from, for example, a fluorine atom, a $C_{1-6}$ alkyl group, a $C_{2-6}$ alkenyl group, and a $C_{2-6}$ alkynyl group. $Z^3$ is more preferably a linear or branched alkylene group, further preferably a linear alkylene group from the viewpoint of particularly favorable ultraviolet durability. The number of carbon atoms constituting the alkylene group of $Z^3$ is preferably in the range from 1 to 6, more preferably in the range from 1 to 3. The alkylene group is as described above.

In the formulae, each $R^{71}$, at each occurrence, independently represents $R^{a'}$. $R^{a'}$ has the same meaning as $R^a$.

The number of Si atoms linearly linked via a $Z^3$ group is at most 5 in $R^a$. That is, in the case where at least one $R^{71}$ is present in $R^a$, two or more Si atoms linearly linked via a $Z^3$ group are present in $R^a$, and the number of such Si atoms linearly linked via a $Z^3$ group is at most 5. Herein, "the number of Si atoms linearly linked via a $Z^3$ group in $R^{a}$" is equal to the number of repeating units —$Z^3$—Si— linearly linked in $R^a$.

One example is represented below, where Si atoms are linked via a $Z^3$ group in $R^a$.

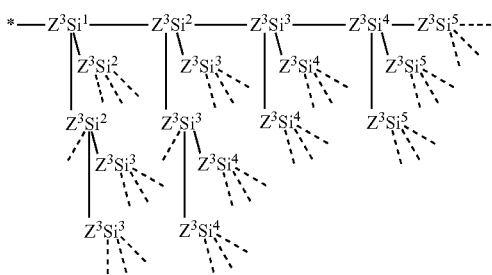

In the formula, "*" means a site bonded to Si in a main chain, and " . . . " means that a predetermined group other than $Z^3$Si is bonded, namely, " . . . " means a position at which repeating of $Z^3$Si is terminated in the case where all three bonds of a Si atom are " . . . ". The superscript number in Si means the number of occurrence of Si linearly linked via a $Z^3$ group when counted from "*". That is, a chain where repeating of $Z^3$Si is terminated at $Si^2$ is a chain where the "number of Si atoms linearly linked via a $Z^3$ group in $R^{a}$" is 2, and similarly, respective chains where repeating of $Z^3$Si is terminated at $Si^3$, $Si^4$ and $Si^5$ mean respective chains where the "number of Si atoms linearly linked via a $Z^3$ group in $R^{a}$" is 3, 4 and 5. As clear from the formula, a plurality of $Z^3$Si chains are present in $R^a$, and all the chains do not necessarily have the same length and, may each have any length.

In a preferable embodiment, the "number of Si atoms linearly linked via a $Z^3$ group in $R^{a}$" is 1 (left formula) or 2 (right formula) in all chains, as represented below.

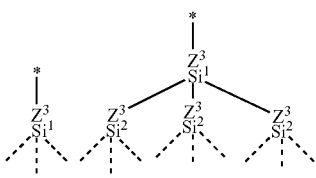

In one embodiment, the number of Si atoms linearly linked via a $Z^3$ group in $R^a$ is 1 or 2, preferably 1.

In the formulae, each $R^{72}$, at each occurrence, independently represents a hydroxyl group or a hydrolyzable group. The "hydrolyzable group" has the same meaning as described above.

Preferably, $R^{72}$ is —OR, wherein R represents a substituted or unsubstituted $C_{1-3}$ alkyl group, more preferably a methyl group.

In the formulae, each $R^{73}$, at each occurrence, independently represents a hydrogen atom or a lower alkyl group. The lower alkyl group is preferably an alkyl group having 1 to 20 carbon atoms, more preferably an alkyl group having 1 to 6 carbon atoms, further preferably a methyl group.

In the formulae, each p1, at each occurrence, is independently an integer of 0 to 3; each q1, at each occurrence, is independently an integer of 0 to 3; and each r1, at each occurrence, is independently an integer of 0 to 3, provided that the sum of p1, q1 and r1 with respect to (—$Z^3$—$SiR^{71}_{p1}R^{72}_{q1}R^{73}_{r1}$) is 3.

In a preferable embodiment, q1 in $R^{a\prime}$ ($R^a$ in the case where no $R^{a\prime}$ is present) at an end of $R^a$ is preferably 2 or more, for example, 2 or 3, more preferably 3.

In a preferable aspect, at least one end of $R^a$ can be —Si(—$Z^3$—$SiR^{72}_{q1}R^{73}_{r1}$)$_2$ or —Si(—$Z^3$—$SiR^{72}_{q1}R^{73}_{r1}$)$_3$, preferably —Si(—$Z^3$—$SiR^{72}_{q1}R^{73}_{r1}$)$_3$. In such a formula, a (—$Z^3$—$SiR^{72}_{q1}R^{73}_{r1}$) unit is preferably (—$Z^3$—$SiR^{72}_3$). In a further preferable embodiment, all ends of $R^a$ can be each —Si(—$Z^3$—$SiR^{72}_{q1}R^{73}_{r1}$)$_3$, preferably —Si(—$Z^3$—$SiR^{72}_3$)$_3$.

In formulae (C1) and (C2), at least one q1 is an integer of 1 to 3, namely, at least one $R^{72}$ is present.

In one embodiment, at least two Si atoms each bonded to the hydroxyl group or the hydrolyzable group are present in formulae (C1) and (C2). That is, at least two $SiR^{72}$ and/or $SiR^b$ structures are present.

In the formulae, each $R^b$, at each occurrence, independently represents a hydroxyl group or a hydrolyzable group. $R^b$ preferably represents a hydroxyl group, —OR, —OCOR, —O—N=C(R)$_2$, —N(R)$_2$, —NHR, or halogen, wherein R represents a substituted or unsubstituted alkyl group having 1 to 4 carbon atoms, and each $R^b$ more preferably represents —OR. Examples of R include unsubstituted alkyl groups such as a methyl group, an ethyl group, a propyl group, an isopropyl group, a n-butyl group and an isobutyl group; and substituted alkyl groups such as a chloromethyl group. Among them, an alkyl group, in particular, an unsubstituted alkyl group is preferable, and a methyl group or an ethyl group is more preferable. The hydroxyl group is not limited, and may be generated by hydrolyzing the hydrolyzable group. More preferably, $R^b$ represents —OR, wherein R represents a substituted or unsubstituted $C_{1-3}$ alkyl group, more preferably a methyl group.

In the formulae, each $R^c$, at each occurrence, independently represents a hydrogen atom or a lower alkyl group. The lower alkyl group is preferably an alkyl group having 1 to 20 carbon atoms, more preferably an alkyl group having 1 to 6 carbon atoms, further preferably a methyl group.

In the formulae, each k1, at each occurrence, independently represents an integer of 0 to 3; each l1, at each occurrence, is independently an integer of 0 to 3; and each m1, at each occurrence, is independently an integer of 0 to 3, provided that the sum of k1, l1 and m1 with respect to ($SiR^a_{k1}R^b_{l1}R^c_{m1}$) is 3.

In one aspect, k1 is preferably 1 to 3, more preferably 3.

Such any compound represented by formulae (C1) and (C2) can be obtained by, for example, introducing a hydroxyl group and then a group having an unsaturated bond into an end of a perfluoropolyether derivative corresponding to an Rf-PFPE- portion, as a raw material, thereafter reacting such a group having an unsaturated bond, and a silyl derivative having a halogen atom, further introducing a hydroxyl group and then a group having an unsaturated bond into an end of the silyl group, and finally reacting the group having an unsaturated bond, introduced, and the silyl derivative. For example, synthesis can be made as described in International Publication No. WO 2014/069592.

Formulae (D1) and (D2):

$$(Rf\text{-}PFPE)_{b1'}\text{-}X\text{-}(CR^d_{k2}R^e_{l2}R^f_{m2})_{b1} \quad (D1)$$

$(R^f_{m2}R^e_{l2}R^d_{k2}C)_{\delta 1}—X^7\text{-PFPE-X}—(CR^d_{k2}R^e_{l2}R^f_{m2})_{\delta 1'}$ (D2)

In formulae (D1) and (D2), Rf and PFPE have the same meanings as described with respect to formulae (A1) and (A2).

In the formulae, each $X^7$ independently represents a single bond or a di- to decavalent organic group. $X^7$ is understood to be a linker which links a perfluoropolyether portion (namely, Rf-PFPE portion or -PFPE- portion) mainly providing water-repellency, surface lubricity, and the like, and a portion (namely, group in parentheses with δ1) providing a binding ability to the base material, in any compound represented by formulae (D1) and (D2). Accordingly, $X^7$ may be any organic group as long as such any compound represented by formulae (D1) and (D2) can be stably present.

In another embodiment, $X^7$ represents $X^e$. $X^e$ has the same meaning as described above.

In the formulae, δ1 is an integer of 1 to 9 and δ1' is an integer of 1 to 9. Such δ1 and δ1' can be varied depending on the valence of $X^7$. In formula (D1), the sum of δ1 and δ1' is the same as the valence of $X^7$. For example, in the case where $X^7$ is a decavalent organic group, the sum of δ1 and δ1' is 10, and for example, δ1 can be 9 and δ1' can be 1, δ1 can be 5 and δ1' can be 5, or δ1 can be 1 and δ1' can be 9. In the case where $X^7$ is a divalent organic group, δ1 and δ1' is 1. In formula (D2), δ1 corresponds to a value obtained by subtracting 1 from the valence of $X^7$.

$X^7$ is preferably a di- to heptavalent, more preferably di- to tetravalent, further preferably divalent organic group.

In one embodiment, $X^7$ is a di- to tetravalent organic group, δ1 is 1 to 3, and δ1' is 1.

In another embodiment, $X^7$ is a divalent organic group, δ1 is 1, and δ1' is 1. In such a case, formulae (D1) and (D2) are represented by the following formulae (D1') and (D2'), respectively.

Rf-PFPE-$X^7$—$CR^d_{k2}R^e_{l2}R^f_{m2}$ (D1')

$R^f_{m2}R^e_{l2}R^d_{k2}C$—$X^7$-PFPE-$X^7$—$CR^d_{k2}R^e_{l2}R^c_{m2}$ (D2')

Examples of $X^7$ are not limited, and include the same as described with respect to $X^1$.

In particular, preferable specific examples of $X^7$ include
—$CH_2OCH_2$—,
—$CH_2O(CH_2)_2$—,
—$CH_2O(CH_2)_3$—,
—$CH_2O(CH_2)_6$—,
—$CH_2O(CH_2)_3Si(CH_3)_2OSi(CH_3)_2(CH_2)_2$—,
—$CH_2O(CH_2)_3Si(CH_3)_2OSi(CH_3)_2OSi(CH_3)_2(CH_2)_2$—,
—$CH_2O(CH_2)_3Si(CH_3)_2O(Si(CH_3)_2O)_2Si(CH_3)_2(CH_2)_2$—,
—$CH_2O(CH_2)_3Si(CH_3)_2O(Si(CH_3)_2O)_3Si(CH_3)_2(CH_2)_2$—,
—$CH_2O(CH_2)_3Si(CH_3)_2O(Si(CH_3)_2O)_{10}Si(CH_3)_2(CH_2)_2$—,
—$CH_2O(CH_2)_3Si(CH_3)_2O(Si(CH_3)_2O)_{20}Si(CH_3)_2(CH_2)_2$—,
—$CH_2OCF_2CHFOCF_2$—,
—$CH_2OCF_2CHFOCF_2CF_2$—,
—$CH_2OCF_2CHFOCF_2CF_2CF_2$—,
—$CH_2OCH_2CF_2CF_2OCF_2$—,
—$CH_2OCH_2CF_2CF_2OCF_2CF_2$—,
—$CH_2OCH_2CF_2CF_2OCF_2CF_2CF_2$—,
—$CH_2OCH_2CF_2CF_2OCF(CF_3)CF_2OCF_2$—,
—$CH_2OCH_2CF_2CF_2OCF(CF_3)CF_2OCF_2CF_2$—,
—$CH_2OCH_2CF_2CF_2OCF(CF_3)CF_2OCF_2CF_2CF_2$—,
—$CH_2OCH_2CHFCF_2OCF_2$—,
—$CH_2OCH_2CHFCF_2OCF_2CF_2$—,
—$CH_2OCH_2CHFCF_2OCF_2CF_2CF_2$—,
—$CH_2OCH_2CHFCF_2OCF(CF_3)CF_2OCF_2$—,
—$CH_2OCH_2CHFCF_2OCF(CF_3)CF_2OCF_2CF_2$—,
—$CH_2OCH_2CHFCF_2OCF(CF_3)CF_2OCF_2CF_2CF_2$—,
—$CH_2OCF_2CHFOCF_2CF_2$—C(O) NH—$CH_2$—,
—$CH_2OCH_2$ $(CH_2)_7CH_2Si(OCH_3)_2OSi(OCH_3)_2(CH_2)_2Si(OCH_3)_2OSi(OCH_3)_2$ $(CH_2)_2$—,
—$CH_2OCH_2CH_2CH_2Si(OCH_3)_2OSi(OCH_3)_2(CH_2)_3$—,
—$CH_2OCH_2CH_2CH_2Si(OCH_2CH_3)_2OSi(OCH_2CH_3)_2(CH_2)_3$—,
—$CH_2OCH_2CH_2CH_2Si(OCH_3)_2OSi(OCH_3)_2(CH_2)_2$—,
—$CH_2OCH_2CH_2CH_2Si(OCH_2CH_3)_2OSi(OCH_2CH_3)_2(CH_2)_2$—,
—$(CH_2)_2$—$Si(CH_3)_2$—$(CH_2)_2$—,
—$CH_2$—,
—$(CH_2)_2$—,
—$(CH_2)_3$—,
—$(CH_2)_4$—,
—$(CH_2)_5$—,
—$(CH_2)_6$—,
—CO—,
—CONH—,
—CONH—$(CH_2)_3$—,
—CON($CH_3$)—$(CH_2)_3$—,
—CON(Ph)-$(CH_2)_3$— wherein Ph means phenyl;
—CONH—$(CH_2)_6$—,
—CON($CH_3$)—$(CH_2)_6$—,
—CON(Ph)-$(CH_2)_6$— wherein Ph means phenyl;
—CONH—$(CH_2)_2NH(CH_2)_3$—,
—CONH—$(CH_2)_6NH(CH_2)_3$—,
—$CH_2$O—CONH—$(CH_2)_3$—,
—$CH_2$O—CONH—$(CH_2)_6$—,
—S—$(CH_2)_3$—,
—$(CH_2)_2S(CH_2)_3$—,
—CONH—$(CH_2)_3Si(CH_3)_2OSi(CH_3)_2(CH_2)_2$—,
—CONH—$(CH_2)_3Si(CH_3)_2OSi(CH_3)_2OSi(CH_3)_2(CH_2)_2$—,
—CONH—$(CH_2)_3Si(CH_3)_2O(Si(CH_3)_2O)_2Si(CH_3)_2(CH_2)_2$—,
—CONH—$(CH_2)_3Si(CH_3)_2O(Si(CH_3)_2O)_3Si(CH_3)_2(CH_2)_2$—,
—CONH—$(CH_2)_3Si(CH_3)_2O(Si(CH_3)_2O)_{10}Si(CH_3)_2(CH_2)_2$—,
—CONH—$(CH_2)_3Si(CH_3)_2O(Si(CH_3)_2O)_{20}Si(CH_3)_2(CH_2)_2$—,
—C(O)O—$(CH_2)_3$—,
—C(O)O—$(CH_2)_6$—,
—$CH_2$—O—$(CH_2)_3$—$Si(CH_3)_2$—$(CH_2)_2$—$Si(CH_3)_2$—$(CH_2)_2$—,
—$CH_2$—O—$(CH_2)_3$—$Si(CH_3)_2$—$(CH_2)_2$—$Si(CH_3)_2$—$CH(CH_3)$—,
—$CH_2$—O—$(CH_2)_3$—$Si(CH_3)_2$—$(CH_2)_2$—$Si(CH_3)_2$—$(CH_2)_3$—,
—$CH_2$—O—$(CH_2)_3$—$Si(CH_3)_2$—$(CH_2)_2$—$Si(CH_3)_2$—$CH(CH_3)$—$CH_2$—,
—$OCH_2$—,
—$O(CH_2)_3$—,
—$OCFHCF_2$—, and

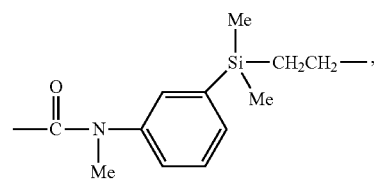

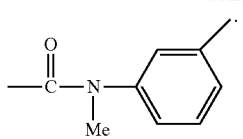

In more preferable embodiment, $X^7$ represents $X^{e'}$. $X^{e'}$ has the same meaning as described above.

In one embodiment, $X^{e'}$ is a single bond. In the present embodiment, PFPE and a group having a binding ability to the base material (namely, a group in parentheses with δ1 in (D1) and (D2)) are directly bonded. It is considered that such a structure is included to thereby strengthen a bonding force between PFPE and the group in parentheses with δ1. It is also considered that a carbon atom (namely, a carbon atom bonded to $R^d$, $R^e$ and $R^f$ in the group in parentheses with δ1) directly bonded to PFPE is less biased in charge and, as a result, a nucleophilic reaction or the like hardly occurs at the carbon atom and the compound is stably bonded to the base material. Such a structure has the advantage of being capable of more enhancing friction durability of a layer formed by the PFPE silane compound.

In the formulae, each $R^d$, at each occurrence, independently represents $-Z^4-CR^{81}_{p2}R^{82}_{q2}R^{83}_{r2}$.

In the formulae, each $Z^4$, at each occurrence, independently represents an oxygen atom or a divalent organic group.

$Z^4$ is preferably a $C_{1-6}$ alkylene group, $-(CH_2)_g-O-(CH_2)_h-$, wherein g is an integer of 0 to 6, for example, an integer of 1 to 6, and h is an integer of 0 to 6, for example, an integer of 1 to 6, or -phenylene-$(CH_2)_i-$, wherein i is an integer of 0 to 6), more preferably a $C_{1-3}$ alkylene group. Such a group is optionally substituted with one or more substituents selected from, for example, a fluorine atom, a $C_{1-6}$ alkyl group, a $C_{2-6}$ alkenyl group, and a $C_{2-6}$ alkynyl group.

In the formulae, each $R^{81}$, at each occurrence, independently represents $R^{d'}$. $R^{d'}$ has the same meaning as $R^d$.

The number of C atoms linearly linked via a $Z^4$ group in $R^d$ is at most 5. That is, in the case where at least one $R^{81}$ is present in $R^d$, two or more C atoms linearly linked via a $Z^4$ group are present in $R^d$, and the number of such C atoms linearly linked via a $Z^4$ group in $R^d$ is at most 5. Herein, the "number of C atoms linearly linked via a $Z^4$ group in $R^{d'}$" is equal to the number of repeating units $-Z^4-C-$ linearly linked in $R^d$.

In a preferable embodiment, the "number of C atoms linearly linked via a $Z^4$ group in $R^{d'}$" is 1 (left formula) or 2 (right formula) in all chains, as represented below.

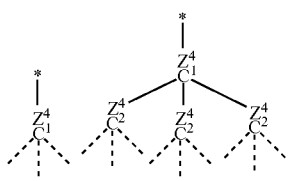

In one embodiment, the number of C atoms linearly linked via a $Z^4$ group in $R^d$ is 1 or 2, preferably 1.

In the formulae, each $R^{82}$, at each occurrence, independently represents $-Y-SiR^{85}_{n2}R^{86}_{3-n2}$.

Each Y, at each occurrence, independently represents a divalent organic group.

In a preferable embodiment, Y is a $C_{1-6}$ alkylene group, $-(CH_2)_{g'}-O-(CH_2)_{h'}-$, wherein g' is an integer of 0 to 6, for example, an integer of 1 to 6, and h' is an integer of 0 to 6, for example, an integer of 1 to 6, or -phenylene-$(CH_2)_{i'}-$, wherein i' is an integer of 0 to 6. Such a group is optionally substituted with one or more substituents selected from, for example, a fluorine atom, a $C_{1-6}$ alkyl group, a $C_{2-6}$ alkenyl group, and a $C_{2-6}$ alkynyl group.

In one embodiment, Y can be a $C_{1-6}$ alkylene group or -phenylene-$(CH_2)_{i'}-$. In the case where Y is any of the groups, light resistance, in particular, ultraviolet resistance can be more enhanced.

Each $R^{85}$, at each occurrence, independently represents a hydroxyl group or a hydrolyzable group.

Examples of the "hydrolyzable group" include the same as in formulae (C1) and (C2).

Preferably, $R^{85}$ is $-OR$, wherein R represents a substituted or unsubstituted $C_{1-3}$ alkyl group, more preferably an ethyl group or a methyl group, in particular, a methyl group.

Each $R^{86}$, at each occurrence, independently represents a hydrogen atom or a lower alkyl group. The lower alkyl group is preferably an alkyl group having 1 to 20 carbon atoms, more preferably an alkyl group having 1 to 6 carbon atoms, further preferably a methyl group.

n2 with respect to a $(-Y-SiR^{85}_{n2}R^{86}_{3-n2})$ unit independently represents an integer of 0 to 3, preferably an integer of 1 to 3, more preferably 2 or 3, particularly preferably 3.

Each $R^{83}$, at each occurrence, independently represents a hydrogen atom or a lower alkyl group. The lower alkyl group is preferably an alkyl group having 1 to 20 carbon atoms, more preferably an alkyl group having 1 to 6 carbon atoms, further preferably a methyl group.

In the formulae, each p2, at each occurrence, is independently an integer of 0 to 3; each q2, at each occurrence, is independently an integer of 0 to 3; and each r2, at each occurrence, is independently an integer of 0 to 3, provided that the sum of p2, q2 and r2 with respect to ($-Z^4-CR^{81}_{p2}R^{82}_{q2}R^{83}_{r2}$) is 3.

In a preferable embodiment, q2 in $R^{d'}$ ($R^d$ in the case where no $R^{d'}$ is present) at an end of $R^d$ is preferably 2 or more, for example, 2 or 3, more preferably 3.

In a preferable embodiment, at least one end of $R^d$ can be $-C(-Y-SiR^{85}_{n2}R^{86}_{3-n2})_2$ or $-C(-Y-SiR^{85}_{n2}R^{86}_{3-n2})_3$, preferably $-C(-Y-SiR^{85}_{n2}R^{86}_{3-n2})_3$. In such a formula, a $(-Y-SiR^{85}_{n2}R^{86}_{3-n2})$ unit is preferably $(-Y-SiR^{85}_3)$. In a further preferable embodiment, all ends of $R^{d1}$ can be each $-C(-Y-SiR^{85}_{n2}R^{86}_{3-n2})_3$, preferably $-C(-Y-SiR^{85}_3)_3$.

In the formulae, each $R^e$, at each occurrence, independently represents $-Y-SiR^{85}_{n2}R^{86}_{3-n2}$. Herein, Y, $R^{85}$, $R^{86}$ and n2 have the same meanings as in $R^{82}$ above.

In the formulae, each $R^f$, at each occurrence, independently represents a hydrogen atom or a lower alkyl group. The lower alkyl group is preferably an alkyl group having 1 to 20 carbon atoms, more preferably an alkyl group having 1 to 6 carbon atoms, further preferably a methyl group.

In the formulae, each k2, at each occurrence, is independently an integer of 0 to 3; each l2, at each occurrence, is independently an integer of 0 to 3; and each m2, at each occurrence, is independently an integer of 0 to 3, provided that the sum of k2, l2 and m2 is 3.

In one embodiment, at least one k2 is 2 or 3, preferably 3.

In one embodiment, k2 is 2 or 3, preferably 3.

In one embodiment, l2 is 2 or 3, preferably 3.

In formulae (D1) and (D2), two or more groups represented by $-Y-SiR^{85}$ are present. More preferably, one or more carbon atoms bonded to two or more —Y—SiR$^{85}$(s) are present. That is, one or more groups represented by —C—(Y—SiR$^{85}_{n2}$R$^{86}_{3-n2}$)$_2$, wherein n2 is an integer of 1 to 3, are preferably present.

In formulae (D1) and (D2), n2 is an integer of 1 to 3, and at least one q2 is 2 or 3, or at least one l2 is 2 or 3. That is, in the formulae, at least two —Y—SiR$^{85}_{n2}$R$^{86}_{3-n2}$ groups are present in the formulae.

The PFPE-containing silane compound represented by formula (D1) or formula (D2) can be produced by combining known methods. For example, a compound represented by formula (D1') where X$^7$ is divalent can be produced as follows, without any limitation.

A double bond-containing group (preferably allyl) and halogen (preferably bromo) are introduced into a polyhydric alcohol represented by HO—X$^7$—C(YOH)$_3$, wherein X$^7$ and Y are each independently a divalent organic group, thereby providing a double bond-containing halide represented by Hal-X$^7$—C(Y—O—R—CH=CH$_2$)$_3$, wherein Hal is halogen, for example, Br, and R is a divalent organic group, for example, an alkylene group. Next, halogen at an end and a perfluoropolyether group-containing alcohol represented by R$^{PFPE}$—OH, wherein R$^{PFPE}$ is a perfluoropolyether group-containing group, are reacted, thereby providing R$^{PFPE}$—O—X$^7$—C(Y—O—R—CH=CH$_2$)$_3$. Next, —CH=CH$_2$ at an end, and HSiCl$_3$ and an alcohol or HSiR$^{85}_3$ are reacted. Thus, R$^{PFPE}$—O—X$^7$—C(Y—O—R—CH$_2$—CH$_2$—SiR$^{85}_3$)$_3$ can be obtained.

The PFPE-containing silane compound can have a number average molecular weight of $5 \times 10^2$ to $1 \times 10^5$, without any limitation. In particular, the compound preferably has a number average molecular weight of 2,000 to 30,000, more preferably 2,500 to 12,000, further preferably 3,000 to 6,000, from the viewpoint of friction durability. In the present invention, the number average molecular weight is defined as a value obtained by $^{19}$F-NMR measurement.

Hereinafter, the substrate for pattern formation of the present invention will be described with reference to an example of a method particularly suitable for production of a substrate for pattern formation will be described, but it goes without saying that the substrate for pattern formation of the present invention and the producing method thereof are not limited to the following description. The following description, when overlapped with the content described above, may be omitted (much the same is true on the following).

A method of producing a substrate for pattern formation of the present embodiment includes forming a PFPE-containing silane compound-derived portion and a region for pattern formation on at least one main face of a base material, to thereby produce a substrate for pattern formation (hereinafter, sometimes referred to as "step (I)").

Step (I) include, for example, at least one of applying a treatment agent including a PFPE-containing silane compound (hereinafter, sometimes referred to as "treatment agent") to at least one main face of a base material, to form a PFPE-containing silane compound-derived layer, and removing the layer formed, to thereby form a region for pattern formation, thereby producing a substrate for pattern formation, including the PFPE-containing silane compound-derived portion and the region for pattern formation (hereinafter, sometimes referred to as step (IA)), subjecting at least one main face of a base material to a pre-treatment (for example, masking treatment) so that no PFPE-containing silane compound-derived layer is formed on a portion corresponding to a region for pattern formation, and thereafter applying a treatment agent including a PFPE-containing silane compound to form a PFPE-containing silane compound-derived layer (or portion), thereby producing a substrate for pattern formation, including the PFPE-containing silane compound-derived portion and the region for pattern formation (hereinafter, sometimes referred to as step (IB)), or selectively applying a treatment agent including a PFPE-containing silane compound, onto at least one main face of a base material, to form a PFPE-containing silane compound-derived layer (or portion), thereby producing a substrate for pattern formation, including the PFPE-containing silane compound-derived portion and a region for pattern formation (hereinafter, sometimes referred to as step (IC)).

Hereinafter, step (IA) will be described.

The treatment agent includes the PFPE-containing silane compound. The treatment agent preferably includes 0.01 to 100 parts by mass, more preferably 0.1 to 30 parts by mass of the PFPE-containing silane compound based on 100 parts by mass of the treatment agent.

The treatment agent may be diluted with a solvent. Such a solvent is not limited, and examples thereof include:

a fluorine atom-containing solvent selected from the group consisting of perfluorohexane, $CF_3CF_2CHCl_2$, $CF_3CH_2CF_2CH_3$, $CF_3CHFCHFC_2F_5$, 1,1,1,2,2,3,3,4,4,5,5,6,6-tridecafluorooctane, 1,1,2,2,3,3,4-heptafluorocyclopentane ((Zeorora H (trade name) or the like), $C_4F_9OCH_3$, $C_4F_9OC_2H_5$, $CF_3CH_2OCF_2CHF_2$, $C_6F_{13}CH=CH_2$, xylene hexafluoride, perfluorobenzene, methyl pentadecafluoroheptyl ketone, trifluoroethanol, pentafluoropropanol, hexafluoroisopropanol, $HCF_2CF_2CH_2OH$, methyl trifluoromethanesulfonate, trifluoroacetic acid, $CF_3O(CF_2CF_2O)_{m1}(CF_2O)_{n1}CF_2CF_3$: wherein m1 and n1 are each independently an integer of 0 or more and 1000 or less and the occurrence order of the respective repeating units in parentheses with m1 or n1 is not limited in the formula, provided that the sum of m1 and n1 is 1 or more; 1,1-dichloro-2,3,3,3-tetrafluoro-1-propene, 1,2-dichloro-1,3,3,3-tetrafluoro-1-propene, 1,2-dichloro-3,3,3-trifluoro-1-propene, 1,1-dichloro-3,3,3-trifluoro-1-propene, 1,1,2-trichloro-3,3,3-trifluoro-1-propene, and 1,1,1,4,4,4-hexafluoro-2-butene. Such a solvent can be used singly or as a mixture of two or more kinds thereof.

The content of moisture contained in the solvent is preferably 20 ppm by mass or less. The content of moisture can be measured by use of a Karl Fischer method. The content of moisture can be in the range to thereby allow storage stability of the treatment agent to be enhanced.

For example, the treatment agent may include other component, in addition to the PFPE-containing silane compound. Such other component is not limited, and examples thereof include a (unreactive) fluoropolyether compound which can be understood as a fluorine-containing oil, preferably a perfluoro(poly)ether compound (hereinafter, referred to as "fluorine-containing oil"), a (unreactive) silicone compound which can be understood as a silicone oil (hereinafter, referred to as "silicone oil"), a catalyst, a lower alcohol, a transition metal, a halide ion, and a compound containing an atom having an unshared electron pair in a molecular structure.

The fluorine-containing oil is not limited, and examples thereof include a compound (perfluoro(poly)ether compound) represented by the following general formula (1):

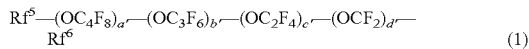

$$Rf^5-(OC_4F_8)_{a'}-(OC_3F_6)_{b'}-(OC_2F_4)_{c'}-(OCF_2)_{d'}-Rf^6 \quad (1)$$

wherein $Rf^5$ represents an alkyl group having 1 to 16 carbon atoms optionally substituted with one or more fluorine atoms (preferably, $C_{1-16}$ perfluoroalkyl group), $Rf^6$ represents an alkyl group having 1 to 16 carbon atoms optionally substituted with one or more fluorine atoms (preferably, $C_{1-16}$ perfluoroalkyl group), a fluorine atom, or a hydrogen atom, and $Rf^5$ and $Rf^6$ are each independently, more preferably, a $C_{1-3}$ perfluoroalkyl group; and a', b', c' and d' represent the respective four numbers of repeating units in perfluoro(poly)ether constituting a main backbone of the polymer and are mutually independently an integer of 0 or more and 300 or less, the sum of a', b', c' and d' is at least 1, preferably 1 to 300, more preferably 20 to 300, the occurrence order of the respective repeating units in parentheses with the subscript a', b', c' or d' is not limited in the formula, and, among such repeating units, for example, $-(OC_4F_8)-$ may be any of $-(OCF_2CF_2CF_2CF_2)-$, $-(OCF(CF_3)CF_2CF_2)-$, $-(OCF_2CF(CF_3)CF_2)-$, $-(OCF_2CF_2CF(CF_3))-$, $-(OC(CF_3)_2CF_2)-$, $-(OCF_2C(CF_3)_2)-$, $-(OCF(CF_3)CF(CF_3))-$, $-(OCF(C_2F_5)CF_2)-$ and $-(OCF_2CF(C_2F_5))-$ and is preferably $-(OCF_2CF_2CF_2CF_2)-$, $-(OC_3F_6)-$ may be any of $-(OCF_2CF_2CF_2)-$, $-(OCF(CF_3)CF_2)-$ and $-(OCF_2CF(CF_3))-$ and is preferably $-(OCF_2CF_2CF_2)-$, and $-(OCF_2F_4)-$ may be any of $-(OCF_2CF_2)-$ and $-(OCF(CF_3))-$ and is preferably $-(OCF_2CF_2)-$.

Examples of the perfluoro(poly)ether compound represented by general formula (1) include a compound represented by any of the following general formulae (1a) and (1b) (which may be adopted singly or as a mixture of two or more kinds thereof).

$$Rf^5-(OCF_2CF_2CF_2)_{b''}-Rf^6 \quad (1a)$$

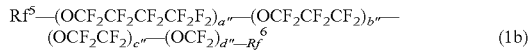

$$Rf^5-(OCF_2CF_2CF_2CF_2F_2)_{a'''}-(OCF_2CF_2CF_2)_{b'''}-(OCF_2CF_2)_{c'''}-(OCF_2)_{d'''}-Rf^6 \quad (1b)$$

In such formulae, $Rf^5$ and $Rf^6$ are as described above; in formula (1a), b'' is an integer of 1 or more and 100 or less; and, in formula (1b), a''' and b''' are each independently an integer of 1 or more and 30 or less, c''' and d''' are each independently an integer of 1 or more and 300 or less, and the occurrence order of the respective repeating units in parentheses with subscript a''', b''', c''', d''' is not limited in the formula.

The fluorine-containing oil may have a number average molecular weight of 1,000 to 30,000. In particular, the number average molecular weight of the compound represented by formula (1a) is preferably 2,000 to 8,000. The compound can have such a number average molecular weight, thereby allowing high surface lubricity to be obtained. In one embodiment, the number average molecular weight of the compound represented by formula (1b) is 3,000 to 8,000. In another embodiment, the number average molecular weight of the compound represented by formula (1b) is 8,000 to 30,000.

The treatment agent can contain, for example, 0 to 500 parts by mass, preferably 0 to 100 parts by mass, more preferably 1 to 50 parts by mass, further preferably 1 to 5 parts by mass of the fluorine-containing oil based on 100 parts by mass of the PFPE-containing silane compound.

The fluorine-containing oil may be a compound represented by general formula Rf'—F, wherein Rf' is a $C_{5-16}$ perfluoroalkyl group, from another viewpoint. The fluorine-containing oil may be a chlorotrifluoroethylene oligomer. The compound represented by Rf'—F and the chlorotrifluoroethylene oligomer are preferable in that high affinity with the PFPE-containing silane compound where Rf is a $C_{1-16}$ perfluoroalkyl group is obtained.

The fluorine-containing oil contributes to enhancing surface lubricity of the layer formed by the treatment agent.

For example, a linear or cyclic silicone oil having 2,000 or less siloxane bonds can be used as the silicone oil. The linear silicone oil may be so-called straight silicone oil or modified silicone oil. Examples of the straight silicone oil include dimethyl silicone oil, methyl phenyl silicone oil, and methyl hydrogen silicone oil. Examples of the modified silicone oil include any straight silicone oil modified by alkyl, aralkyl, polyether, higher fatty acid ester, fluoroalkyl, amino, epoxy, carboxyl, alcohol, or the like. Examples of the cyclic silicone oil include cyclic dimethylsiloxane oil.

The treatment agent can include, for example, 0 to 50 parts by mass, preferably 0 to 5 parts by mass of such silicone oil based on 100 parts by mass of the PFPE-containing silane compound (in the case of two or more kinds, the total thereof, much the same is true on the following).

The silicone oil contributes to enhancing surface lubricity of the layer to be formed by the treatment agent.

Examples of the catalyst include acids (for example, acetic acid and trifluoroacetic acid), bases (for example, ammonia, triethylamine, and diethylamine), and transition metals (for example, Ti, Ni, and Sn).

The catalyst promotes hydrolysis and dehydration condensation of the PFPE-containing silane compound, and promotes formation of the layer to be formed by the treatment agent.

Examples of the lower alcohol as other component described above include an alcohol compound having 1 to 6 carbon atoms.

Examples of the transition metal include platinum, ruthenium and rhodium.

Examples of the halide ion include a chloride ion.

Examples of the compound containing an atom having an unshared electron pair in a molecular structure include diethylamine, triethylamine, aniline, pyridine, hexamethylphosphoramide, N,N-diethylacetamide, N,N-diethylformamide, N,N-dimethylacetamide, N-methylformamide, N,N-dimethylformamide, N-methylpyrrolidone, tetramethylurea, dimethyl sulfoxide (DMSO), tetramethylene sulfoxide, methylphenyl sulfoxide, and diphenyl sulfoxide. Among such compounds, dimethyl sulfoxide or tetramethylene sulfoxide is preferably used.

Examples of such other component include, not only the above, but also tetraethoxysilane, methyltrimethoxysilane, 3-aminopropyltrimethoxysilane, 3-glycidoxypropyltrimethoxysilane, and methyltriacetoxysilane.

In one embodiment, the treatment agent does not include any fluorine-containing oil, silicone oil, catalyst, lower alcohol, transition metal, halide ion, and compound containing an atom having an unshared electron pair in a molecular structure, as other component above.

The treatment agent can be formed into a pellet by impregnating a porous material, for example, a porous ceramic material or a metal fiber for example that obtained by solidifying a steel wool, therewith. The pellet can be used in, for example, vacuum deposition.

The treatment agent is applied to at least one main face of a base material, thereby forming a PFPE-containing silane compound-derived layer. Such formation of a PFPE-containing silane compound-derived layer may be made by forming a film of the treatment agent on the base material and, if necessary, subjecting the film to a post-treatment. The base material may be, if necessary, partially protected by masking or the like.

The film of the treatment agent can be formed by applying the treatment agent to a main face of the base material so that the main face is coated. The coating method is not limited. For example, a wet coating method and a dry coating method can be used.

Examples of the wet coating method include dip coating, spin coating, flow coating, spray coating, roll coating, gravure coating, and similar methods.

Examples of the dry coating method include deposition (usually, vacuum deposition), sputtering, chemical deposition (CVD), and similar methods. Specific examples of the deposition method (usually, vacuum deposition method) include resistive heating, high-frequency heating using electron beam, microwave or the like, ion beam, and similar methods. Specific examples of the CVD method include plasma-CVD, optical CVD, thermal CVD, and similar methods.

Furthermore, coating according to an atmospheric pressure plasma method can also be made.

Next, the film is, if necessary, subjected to a post-treatment. The post-treatment is not limited, and, is, for example, made by sequentially or simultaneously performing water feeding and dry heating.

A PFPE-containing silane compound-derived layer is formed on the main face of a base material. The layer thus obtained is low in chargeability. The layer formed by the treatment agent can be a functional thin film which is not only low in chargeability, but also has water-repellency, oil-repellency, antifouling property (for example, preventing fouling such as fingerprints from adhering), waterproof property (preventing water from penetrating into an electronic component and the like), surface lubricity (or lubricity, for example, wiping property of fouling such as fingerprints, and excellent texture to fingers), friction durability, transparency, and the like, depending on compositional features of the treatment agent to be used.

Next, the layer formed by the treatment agent is partially removed, and thus a region for pattern formation is formed.

Such formation of a region for pattern formation is preferably made using, for example, laser, plasma, ultraviolet (UV), or vacuum ultraviolet (VUV) irradiation.

For example, an exposure treatment using a photomask (for example, reticle) can be conducted in UV irradiation or the like. Such a treatment using a photomask can be conducted by, for example, allowing a photomask having a pattern to adhere to the PFPE-containing silane compound-derived layer, and irradiating the resultant with UV.

The exposure treatment can be conducted in the method, by use of a non-contact exposure system (proximity exposure or projection exposure) and a contact exposure system (contact exposure). Such proximity exposure is preferably conducted at an interval between the mask and the layer formed using the treatment agent including a PFPE-containing silane compound, of 10 µm or less, more preferably 3 µm or less.

The layer formed by the treatment agent including a PFPE-containing silane compound (PFPE-containing silane compound-derived layer) is decomposed and removed in the formation of the region for pattern formation in the present invention. The PFPE-containing silane compound-derived layer is a layer made of an organic material, and thus can be easily decomposed by laser irradiation or the like (as compared with, for example, a case of an inorganic material). Accordingly, the present invention enables pattern formation to be more facilitated and enables patterning in a short time to be made. The base material for pattern formation and the producing method thereof of the present invention can contribute to enhancing production efficiency.

Conventionally, a pattern has been formed using a photoresist in a method of forming a pattern on a main face of a base material. Such a method using a photoresist usually needs a complicated process. On the contrary, the formation of the region for pattern formation in the present invention can be conducted by a simpler process. Accordingly, the formation of the region for pattern formation in the present invention can also contribute to reducing cost.

Hereinafter, step (IB) will be described.

Step (IB) includes, first, subjecting at least one main face of a base material to a pre-treatment (for example, masking treatment) so that no PFPE-containing silane compound-derived layer is formed on a portion corresponding to a region for pattern formation.

A method usually conducted can be used in the masking treatment. For example, a metal mask can be used.

Step (IB) includes, then, applying a treatment agent including a PFPE-containing silane compound, to form a PFPE-containing silane compound-derived layer (or portion). The formation of the layer (or portion) can be conducted using the same method as the method of forming a PFPE-containing silane compound-derived layer, described with respect to step (IA).

In a more specific embodiment, step (IB) can include conducting a masking treatment using a metal mask, thereafter applying a treatment agent including a PFPE-containing silane compound to a base material subjected to the masking treatment, by use of a deposition method (usually, vacuum deposition method), to form a PFPE-containing silane compound-derived layer (or portion), thereby producing a substrate for pattern formation, including the PFPE-containing silane compound-derived portion and a region for pattern formation.

After the layer is formed using the treatment agent including a PFPE-containing silane compound, removal of the material used for masking can be, if necessary, conducted, thereby producing such a substrate for pattern formation.

After the layer is formed using the treatment agent including a PFPE-containing silane compound, decomposition and removal of the PFPE-containing silane compound-derived layer, may be, if necessary, conducted. The decomposition and removal of the PFPE-containing silane compound-derived layer can be conducted in the same manner as the method described with respect to step (IA).

Hereinafter, step (IC) will be described.

Step (IC) includes selectively applying a treatment agent including a PFPE-containing silane compound to at least one main face of a base material, to form a PFPE-containing silane compound-derived layer (or portion), thereby producing a substrate for pattern formation, including the PFPE-containing silane compound-derived portion and a region for pattern formation.

An inkjet system or the like can be used in the method of selectively applying the treatment agent including a PFPE-containing silane compound. The inkjet system can be used in a method which can be usually conducted, and, for example, can discharge the treatment agent including a PFPE-containing silane compound, through a nozzle, and thus selectively form a pattern portion on the base material.

After the PFPE-containing silane compound-derived layer (or portion) is formed, decomposition and removal of the PFPE-containing silane compound-derived layer may be, if necessary, conducted. Such decomposition and removal of the PFPE-containing silane compound-derived layer can be conducted in the same manner as the method described with respect to step (IA).

According to steps (IA), (IB) and (IC), a PFPE-containing silane compound-derived portion and a pattern portion can be provided on at least one main face of a base material according to a simpler method.

(Pattern Substrate)

The pattern substrate of the present invention includes the substrate for pattern formation of the present invention, and a pattern portion, in which the pattern portion is disposed in the second region of the substrate for pattern formation.

That is, the pattern substrate of the present invention includes at least, a base material, a PFPE-containing silane compound-derived portion, and a pattern portion, wherein
the base material includes at least one main face having a first region and a second region adjacent to the first region,
the PFPE-containing silane compound-derived portion is disposed in the first region, and
the pattern portion is disposed in the second region.

In the present invention, the pattern portion is provided directly (namely, with no other layer or portion being interposed) in the second region. Accordingly, the present invention does not particularly need any processing for bonding the pattern portion and other layer or portion.

The thickness of the pattern portion is, for example, in the range from 1 nm to 10 μm.

In one embodiment, the pattern portion includes only substantially a metal or an oxide thereof.

In a preferable embodiment, a plurality of PFPE-containing silane compound-derived portions and a plurality of pattern portions are present in the pattern substrate of the present invention.

The pattern portion can include at least one selected from the group consisting of a metal and an oxide thereof.

Examples of the metal can include silver, gold, platinum, palladium, copper, indium, tin, aluminum, zinc, titanium, magnesium, and an alloy thereof. Examples of the oxide can include indium tin oxide (ITO), zinc oxide (ZnO), aluminum-doped zinc oxide (AZO ($Al_2O_3$, ZnO)), fluorine-doped tin oxide (FTO), tin oxide ($SnO_2$), gallium-doped zinc oxide (GZO), and indium zinc oxide (IZO ($In_2O_3$, ZnO)).

In a preferable embodiment, the pattern portion preferably includes at least one selected from the group consisting of silver, gold, platinum, palladium, copper, indium, tin, aluminum, zinc, titanium, magnesium, and an alloy thereof, and an oxide of such a metal and alloy. The pattern portion more preferably includes at least one selected from the group consisting of silver, gold, copper, and indium tin oxide. Such a pattern portion is excellent in conductivity and is particularly useful as an electrode material or the like.

In one embodiment, the pattern portion forms a transparent electrode or an electrode wiring.

In the present embodiment, the pattern portion preferably has a continuous structure so as to be able to serve as an electrode or a wiring. In the present embodiment, the PFPE-containing silane compound-derived portion can serve as an insulating portion. Accordingly, the PFPE-containing silane compound-derived portion is preferably disposed so as to be able to insulate an electrode or a wiring.

The transparent electrode can be formed from, for example, an inorganic transparent conductor containing a transparent oxide semiconductor as a main component, or an organic transparent conductor containing a conductive polymer as a main component.

Examples of the transparent oxide semiconductor can include indium tin oxide, zinc oxide, aluminum-doped zinc oxide, fluorine-doped tin oxide, tin oxide, gallium-doped zinc oxide (GZO), and indium zinc oxide.

Examples of the conductive polymer can include polythiophene-based, polyaniline-based, and polypyrrole-based conductive polymer materials, and a polythiophene-based conductive polymer material is preferably used. Examples of the polythiophene-based conductive polymer material can include a PEDOT/PSS-based material where polyethylene dioxythiophene (PEDOT) is doped with polystyrene sulfonic acid (PSS).

As a metal constituting an electrode wiring, any metal described as a metal for forming the pattern portion, an alloy thereof, or an oxide thereof can be used, and gold, silver, copper, or the like can be preferably used.

Hereinafter, the pattern substrate of the present invention will be described with reference to a method particularly suitable for production of a pattern substrate, but it goes without saying that the pattern substrate of the present invention and the producing method thereof are not limited by the following method.

A method of producing a pattern substrate according to the present embodiment includes forming a pattern portion in the region for pattern formation of the substrate for pattern formation, obtained in step (I), to produce a pattern substrate (hereinafter, sometimes referred to as "step (II)").

That is, the method of producing a pattern substrate according to the present embodiment includes
forming a PFPE-containing silane compound-derived portion and a region for pattern formation on at least one main face of a base material, to produce a substrate for pattern formation (step (I)), and
forming a pattern portion in the region for pattern formation of the substrate for pattern formation, to produce a pattern substrate (step (II)).

Step (I) can be conducted in the same manner as described above.

Hereinafter, step (II) will be described.

The pattern portion may be formed by either a dry method or a wet method.

The wet method can be conducted by applying a composition for pattern portion formation (so-called conductive ink) to the region for pattern formation of the substrate for pattern formation. Examples of the application method can specifically include coating and dipping, more specifically, dip coating, spin coating, flow coating, spray coating, roll coating, gravure coating, and similar methods.

The composition for pattern portion formation contains a conductive material, and can contain, if necessary, a binder and a solvent. The composition for pattern portion formation may further contain an additive such as a dispersion aid, a curing accelerator, a leveling agent, an antisettling agent, a covering material of the conductive material, a coupling agent, or a defoaming agent. A pattern portion formed by such a composition for pattern portion formation can serve as a wiring pattern (conductive pattern portion) or an electrode.

In one embodiment, the composition for pattern portion formation contains a binder such as a resin material. In the present embodiment, the conductive material is preferably secured so as to be in contact with each other.

The binder which can be used is a resin material. The resin material which can be used is, for example, a thermosetting resin, a thermoplastic resin, or an energy line irradiation type resin, and specific examples can include an epoxy resin, a phenol resin, a polyimide resin, a polyurethane resin, a melamine resin, a urea resin, polyvinylidene fluoride (PVDF), and an alkali resin. Such a resin material may be used singly or in combinations of two or more kinds thereof. Examples of the energy line can include electron beam, ultraviolet light, visible light, gamma ray, and electron beam, and ultraviolet light is preferably used from the viewpoint of production equipment.

The solvent which can be included in the composition for pattern portion formation is not limited as long as it can allow the conductive material and the binder to be dispersed therein. For example, a volatile solvent can be used as the solvent. Examples can include alcohols such as methanol, ethanol, propanol and butanol; hydrocarbon-based compounds such as n-heptane, n-octane, decane, dodecane, tetradecane, toluene, xylene, cymene, durene, indene, dipentene, tetrahydronaphthalene, decahydronaphthalene and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether and p-dioxane; and polar compounds such as propylene carbonate, γ-butyrolactone, N-methyl-2-pyrrolidone, dimethylformamide, dimethyl sulfoxide and cyclohexanone. In particular, an alcohol, a hydrocarbon-based compound, or an ether-based compound is preferably used from the viewpoint of favorable dispersibility of the conductive material and favorable stability of dispersion. In addition thereto, water may be used as the solvent.

The composition for pattern portion formation can be solidified by applying the composition for pattern portion formation, to the region for pattern formation of the substrate for pattern formation, and thereafter, if necessary, drying, heating, and/or burning the resultant. For example, laser irradiation, plasma treatment, or energy line irradiation can be used in the method.

The thickness of a pattern portion formed using the wet method is, for example, in the range from 10 nm to 10 μm.

For example, sputtering, deposition (usually, vacuum deposition), CVD, and a similar method can be used for the dry method. Specific examples of the deposition method (usually, vacuum deposition method) include resistive heating, high-frequency heating using electron beam, microwave or the like, ion beam, and similar methods. Specific examples of the CVD method include plasma-CVD, optical CVD, thermal CVD, and similar methods.

Furthermore, coating according to an atmospheric pressure plasma method can also be made.

The dry method is favorable from the viewpoint that only a compound for forming a pattern portion can be used (dilution with an organic solvent or the like is not particularly needed) and thus impurities such as an organic substance are hardly incorporated. The dry method enables a pattern portion including only substantially a metal or an oxide thereof to be formed. The dry method is also favorable for formation of a fine pattern portion.

The dry method, in particular, deposition, preferably vacuum deposition is preferably used in formation of the region for pattern formation.

The thickness of a pattern portion formed using the dry method is, for example, in the range from 1 nm to 1000 nm.

Next, the substrate on which the pattern portion is formed is, if necessary, subjected to a post-treatment. The post-treatment is not limited, and, is, for example, made by sequentially or simultaneously performing water feeding and dry heating.

A step of removing the PFPE-containing silane compound-derived layer from a main face of the base material may be, if necessary, further conducted.

In one embodiment, the PFPE-containing silane compound-derived layer is not removed from a main face of the base material.

In the case where the pattern portion includes the conductive material, the pattern substrate of the present invention may be used as a substrate for a circuit. In such a case, the PFPE-containing silane compound-derived portion may serve as an insulating region. As long as the PFPE-containing silane compound-derived portion may serve as an insulating layer, the pattern portion may be non-continuously formed on the PFPE-containing silane compound-derived portion.

EXAMPLES

Example 1

A PFPE-containing silane compound was used to form a pattern, as described below.

A metal mask was provided on a glass base material, and thereafter, the base material was treated with PFPE-containing silane compound 1 having the following structure, according to a vacuum deposition method. The vacuum deposition was conducted by setting PFPE silane compound 1 in a chamber at a chamber pressure of $10^{-3}$ Pa, and heating it to 300° C. The base material treated was left to still stand at room temperature for 24 hours, to produce a substrate for pattern formation, treated with the PFPE-containing silane compound.

PFPE-containing silane compound 1
$CF_3CF_2CF_2O(CF_2CF_2CF_2O)_nCF_2(CH_2CH[Si(OCH_3)_3])_3H$
(n=25)

The substrate for pattern formation, obtained as above, was subjected to metal patterning, as described below.

The substrate for pattern formation was subjected to a sputtering treatment with platinum having a purity of 99.9% according to a magnetron sputtering method. The sputtering deposition in the magnetron sputtering method was performed at a chamber pressure in sputtering, of 0.1 Pa, with an argon gas so that a thickness of 10 nm was obtained. As described above, a substrate treated with platinum was obtained.

Example 2

A substrate treated with platinum was obtained by conducting the same operation as in Example 1 except that PFPE-containing silane compound 2 below was used instead of PFPE-containing silane compound 1.

PFPE-containing silane compound 2
$CF_3O(CF_2CF_2O)_m(CF_2O)_lCF_2(CH_2CH[Si(OCH_3)_3])_3H$
(m=23, l=18)

Example 3

A substrate treated with silver was obtained by conducting the same operation as in Example 1 except that silver was used instead of platinum.

Comparative Example 1

A substrate treated with platinum was obtained by conducting the same operation as in Example 1 except that trimethoxypropylsilane was used instead of PFPE-containing silane compound 1.

(Evaluation of Patterning Property)

Each of the substrates obtained was subjected to measurement of intensity of any metal element (a platinum element in Examples 1 and 2, and Comparative Example 1, or a silver element in Example 3) included in PFPE-containing silane compound-derived portion [A] and metal-containing pattern portion [B], with an X-ray photoelectron spectroscopic method (XPS). The ratio of intensity (B/A) of the metal elements obtained in respective regions A and B was calculated from the results of XPS measurement, and considered as evaluation of patterning property. The results are shown in Table 1. It is indicated in Table 1 that patterning property is lower as the value of B/A is closer to 1, and patterning property is more excellent as the value is farther from 1.

TABLE 1

| | Intensity in PFPE silane patterning region [A] (c/s) | Intensity in non-patterning region [B] (c/s) | Patterning property [B/A] |
|---|---|---|---|
| Example 1 | $0.31 \times 10^4$ | $4.9 \times 10^4$ | 16 |
| Example 2 | $0.44 \times 10^4$ | $5.2 \times 10^4$ | 12 |
| Example 3 | $0.3 \times 10^4$ | $4.2 \times 10^4$ | 14 |
| Comparative Example 1 | $5.2 \times 10^4$ | $5.4 \times 10^4$ | 1 |

INDUSTRIAL APPLICABILITY

The substrate for pattern formation of the present invention is used for formation of a pattern substrate. The pattern substrate of the present invention can be used in various fields.

The invention claimed is:

1. A pattern substrate comprising a substrate for pattern formation and a pattern portion, the substrate for pattern formation comprising:
    at least a base material and a perfluoro(poly)ether group-containing silane compound-derived portion, wherein
    the base material comprises at least one main face having a first region and a second region which is a region for pattern formation, adjacent to the first region,
    the perfluoro(poly)ether group-containing silane compound-derived portion is disposed in the first region,
    the pattern portion is disposed in the second region of the substrate for pattern formation, and
    the pattern portion comprises at least one selected from the group consisting of a metal and an oxide thereof,
    wherein the perfluoro(poly)ether group-containing silane compound is at least one perfluoropolyether group-containing silane compound represented by formula (A1), (A2), (B1), (B2), (C1), (C2), (D1) or (D2):

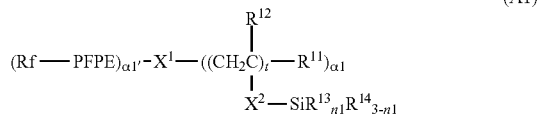
(A1)

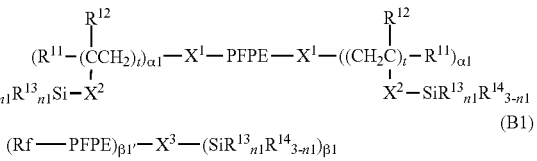
(A2)

$(Rf\text{---}PFPE)_{\beta1'}\text{---}X^3\text{---}(SiR^{13}{}_{n1}R^{14}{}_{3-n1})_{\beta1}$ (B1)

$(R^{14}{}_{3-n1}R^{13}{}_{n1}Si)_{\beta1}\text{---}X^3\text{---}PFPE\text{---}X^3\text{---}(SiR^{13}{}_{n1}R^{14}{}_{3-n1})_{\beta1}$ (B2)

$(Rf\text{---}PFPE)_{\gamma1'}\text{---}X^5\text{---}(SiR^a{}_{k1}R^b{}_{l1}R^c{}_{m1})_{\gamma1}$ (C1)

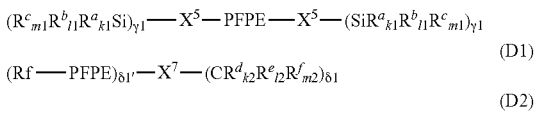
(C2)

$(Rf\text{---}PFPE)_{\delta1'}\text{---}X^7\text{---}(CR^d{}_{k2}R^e{}_{l2}R^f{}_{m2})_{\delta1}$ (D1)

$(R^f{}_{m2}R^e{}_{l2}R^d{}_{k2}C)_{\delta1}\text{---}X^7\text{---}PFPE\text{---}X^7\text{---}(CR^d{}_{k2}R^e{}_{l2}R^f{}_{m2})_{\delta1}$ (D2)

wherein:
    each PFPE, at each occurrence, independently is a group represented by formula:

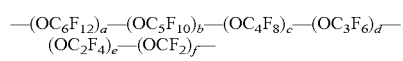

wherein a, b, c, d, e and f are each independently an integer of 0 or more and 200 or less, the sum of a, b, c, d, e and f is at least 1, and the occurrence order of the respective repeating units in parentheses with a, b, c, d, e or f is not limited in the formula;

each Rf, at each occurrence, independently represents an alkyl group having 1 to 16 carbon atoms, optionally substituted with one or more fluorine atoms;

each $R^{13}$, at each occurrence, independently represents a hydroxyl group or a hydrolyzable group;

each $R^{14}$, at each occurrence, independently represents a hydrogen atom or an alkyl group having 1 to 22 carbon atoms;

each $R^{11}$, at each occurrence, independently represents a hydrogen atom or a halogen atom;

each $R^{12}$, at each occurrence, independently represents a hydrogen atom or a lower alkyl group;

n1 with respect to a ($—SiR^{13}{}_{n1}R^{14}{}_{3-n1}$) unit is independently an integer of 0 to 3;

provided that at least one n1 in formulae (A1), (A2), (B1) and (B2) is an integer of 1 to 3;

each $X^1$, at each occurrence, independently represents a single bond or a di- to decavalent organic group;

each $X^2$, at each occurrence, independently represents a single bond or a divalent organic group;

each t, at each occurrence, is independently an integer of 1 to 10;

each α1, at each occurrence, is independently an integer of 1 to 9;

each α1' is independently an integer of 1 to 9;

each $X^3$, at each occurrence, independently represents a single bond or a di- to decavalent organic group;

each β1, at each occurrence, is independently an integer of 1 to 9;

each β1' is independently an integer of 1 to 9;

each $X^5$, at each occurrence, independently represents a single bond or a di- to decavalent organic group;

each γ1, at each occurrence, is independently an integer of 1 to 9;

each γ1' is independently an integer of 1 to 9;

each $R^a$, at each occurrence, independently represents $-Z^3-SiR^{71}_{p1}R^{72}_{q1}R^{73}_{r1}$;

each $Z^3$, at each occurrence, independently represents an oxygen atom or a divalent organic group;

each $R^{71}$, at each occurrence, independently represents $R^{a'}$;

$R^{a'}$ has the same meaning as $R^a$;

the number of Si atoms linearly linked via a $Z^3$ group in $R^a$ is at most 5;

each $R^{72}$, at each occurrence, independently represents a hydroxyl group or a hydrolyzable group;

each $R^{73}$, at each occurrence, independently represents a hydrogen atom or a lower alkyl group;

each p1, at each occurrence, is independently an integer of 0 to 3;

each q1, at each occurrence, is independently an integer of 0 to 3;

each r1, at each occurrence, is independently an integer of 0 to 3;

provided that the sum of p1, q1 and r1 with respect to $(-Z^3-SiR^{71}_{p1}R^{72}_{q1}R^{73}_{r1})$ is 3 and at least one q1 in formulae (C1) and (C2) is an integer of 1 to 3;

each $R^b$, at each occurrence, independently represents a hydroxyl group or a hydrolyzable group;

each $R^c$, at each occurrence, independently represents a hydrogen atom or a lower alkyl group;

each k1, at each occurrence, is independently an integer of 0 to 3;

each l1, at each occurrence, is independently an integer of 0 to 3;

each m1, at each occurrence, is independently an integer of 0 to 3;

provided that the sum of k1, l1 and m1 with respect to $(SiR^a_{k1}R^b_{l1}R^c_{m1})$ is 3;

each $X^7$ independently represents a single bond or a di- to decavalent organic group;

each δ1 is independently an integer of 1 to 9;

each δ1' is independently an integer of 1 to 9;

each $R^d$, at each occurrence, independently represents $-Z^4-CR^{81}_{p2}R^{82}_{q2}R^{83}_{r2}$;

each $Z^4$, at each occurrence, independently represents an oxygen atom or a divalent organic group;

each $R^{81}$, at each occurrence, independently represents $R^{d'}$;

$R^{d'}$ has the same meaning as $R^d$;

the number of C atoms linearly linked via a $Z^4$ group in $R^d$ is at most 5;

each $R^{82}$, at each occurrence, independently represents $-Y-SiR^{85}_{n2}R^{86}_{3-n2}$;

each Y, at each occurrence, independently represents a divalent organic group;

each $R^{85}$, at each occurrence, independently represents a hydroxyl group or a hydrolyzable group;

each $R^{86}$, at each occurrence, independently represents a hydrogen atom or a lower alkyl group;

n2 with respect to a $(-Y-SiR^{85}_{n2}R^{86}_{3-n2})$ unit independently represents an integer of 0 to 3;

each $R^{83}$, at each occurrence, independently represents a hydrogen atom or a lower alkyl group;

each p2, at each occurrence, is independently an integer of 0 to 3;

each q2, at each occurrence, is independently an integer of 0 to 3;

each r2, at each occurrence, is independently an integer of 0 to 3;

provided that the sum of p2, q2 and r2 with respect to $(-Z^4-CR^{81}_{p2}R^{82}_{q2}R^{83}_{r2})$ is 3;

each $R^e$, at each occurrence, independently represents $-Y-SiR^{85}_{n2}R^{86}_{3-n2}$;

each $R^f$, at each occurrence, independently represents a hydrogen atom or a lower alkyl group;

each k2, at each occurrence, is independently an integer of 0 to 3;

each l2, at each occurrence, is independently an integer of 0 to 3; and each m2, at each occurrence, is independently an integer of 0 to 3;

provided that the sum of k2, l2 and m2 with respect to $(CR^d_{k2}R^e_{l2}R^f_{m2})$ is 3 and two or more groups represented by $-Y-SiR^{85}_{n2}R^{86}_{3-n2}$ in which n2 is 1 or more are present in formulae (D1) and (D2).

2. The pattern substrate according to claim 1, wherein the metal comprises at least one selected from the group consisting of silver, gold, platinum, palladium, copper, indium, tin, aluminum, zinc, titanium, magnesium, and an alloy thereof.

3. A method of producing the pattern substrate according to claim 1, the method comprising
   forming the perfluoro(poly)ether group-containing silane compound-derived portion and the region for pattern formation on at least one main face of the base material, to produce the substrate for pattern formation, and
   forming the pattern portion in a region for pattern formation of the substrate for pattern formation, to produce the pattern substrate.

4. The method of producing a pattern substrate according to claim 3, wherein the pattern portion comprises at least one selected from the group consisting of a metal and an oxide thereof.

5. The method of producing a pattern substrate according to claim 4, wherein the metal comprises at least one selected from the group consisting of silver, gold, platinum, palladium, copper, indium, tin, aluminum, zinc, titanium, magnesium, and an alloy thereof.

6. The method of producing a pattern substrate according to claim 3, wherein the pattern portion is formed by a deposition method.

* * * * *